United States Patent
Satou et al.

(10) Patent No.: US 10,403,829 B2
(45) Date of Patent: Sep. 3, 2019

(54) PHOTOELECTRIC CONVERSION ELEMENT, SOLAR CELL USING THE SAME, AND METHOD FOR MANUFACTURING PHOTOELECTRIC CONVERSION ELEMENT

(71) Applicant: FUJIFILM Corporation, Tokyo (JP)

(72) Inventors: Hirotaka Satou, Ashigarakami-gun (JP); Katsumi Kobayashi, Ashigarakami-gun (JP)

(73) Assignee: FUJIFILM Corporation, Tokyo (JP)

(*) Notice: Subject to any disclaimer, the term of this patent is extended or adjusted under 35 U.S.C. 154(b) by 225 days.

(21) Appl. No.: 15/294,054

(22) Filed: Oct. 14, 2016

(65) Prior Publication Data

US 2017/0033299 A1 Feb. 2, 2017

Related U.S. Application Data

(63) Continuation of application No. PCT/JP2015/061724, filed on Apr. 16, 2015.

(30) Foreign Application Priority Data

Apr. 18, 2014 (JP) ................. 2014-086642
Mar. 20, 2015 (JP) ................. 2015-057611

(51) Int. Cl.
*H01L 31/00* (2006.01)
*H01L 51/00* (2006.01)
*H01G 9/20* (2006.01)
*H01L 51/42* (2006.01)
*H01L 51/44* (2006.01)

(52) U.S. Cl.
CPC ....... *H01L 51/0077* (2013.01); *H01G 9/2031* (2013.01); *H01L 51/0032* (2013.01);
(Continued)

(58) Field of Classification Search
CPC ............ H01L 51/0077; H01L 51/0032; H01L 51/4213
See application file for complete search history.

(56) References Cited

U.S. PATENT DOCUMENTS

| 6,150,536 A | 11/2000 | Chondroudis et al. |
| 2015/0122314 A1* | 5/2015 | Snaith ................. H01L 51/4213 136/255 |
| 2016/0137915 A1 | 5/2016 | Han et al. |

FOREIGN PATENT DOCUMENTS

| CN | 103762344 A | 4/2014 |
| JP | 2001-055568 A | 2/2001 |

(Continued)

OTHER PUBLICATIONS

Guan et al., "[H3N(CH2)7NH3]8(CH3NH3)2Sn(IV)Sn(II)12146—a mixed-valent hybrid compound with a uniquely templated defect-perovskite structure," Chem. Commun., 2005, 48-50 (Year: 2004).*

(Continued)

*Primary Examiner* — Angelo Trivisonno
(74) *Attorney, Agent, or Firm* — Sughrue Mion, PLLC

(57) ABSTRACT

Provided are a photoelectric conversion element including a first electrode having a photosensitive layer including a light absorber on a conductive support and a second electrode, in which the light absorber includes a compound having a perovskite-type crystal structure having an organic cation represented by Formula (IA) below, a cation of a metallic atom, and an anion that is an anionic atom or atomic group, a solar cell, and a method for manufacturing a photoelectric conversion element, including bringing a layer in which a photosensitive layer is to be formed into contact with liquid including the above-described compound.

$$[R^4-NH_2(H^+)]_{1-n}\{[(R^B)_{n2}-L-NH_2](H^+)\}_n \quad \text{Formula (IA)}$$

in the formula, $R^A$ represents a specific group such as an alkyl group. $R^B$ represents $NR^1R^2$ or $(NR^1R^2R^3)^+$, and $R^1$ to (Continued)

$R^3$ represent a hydrogen atom or a substituent. L represents a linking group. n2 represents an integer of 1 or more. Here, $(R^B)_{n2}$-L is a group different from $R^A$. n represents a numerical value satisfying $0<n<1.00$.

6 Claims, 2 Drawing Sheets

(52) U.S. Cl.
CPC ........ H01L 51/4213 (2013.01); H01L 51/441 (2013.01); *H01G 9/2059* (2013.01); *H01L 51/4226* (2013.01); *Y02E 10/542* (2013.01); *Y02E 10/549* (2013.01); *Y02P 70/521* (2015.11)

(56) References Cited

FOREIGN PATENT DOCUMENTS

| | | |
|---|---|---|
| JP | 2015-119102 A | 6/2015 |
| KR | 10-1172374 B1 | 8/2012 |
| WO | 2013/126385 A1 | 8/2013 |
| WO | 2014/168119 A1 | 10/2014 |

OTHER PUBLICATIONS

Jun Guan, "Syntheses, Characterizations and Properties of Organic-Inorganic Perovskite Compounds," Ph.D. dissertation, Univ. of Houston, 2001. (Year: 2001).*

Jun Guan et al., "$[H_3N(CH_2)_7NH_3]_8(CH_3NH_3)_2Sn(IV)Sn(II)_{12}I_{46}$—a mixed-valent hybrid compound with a uniquely templated defect-perovskite structure," Chemical Communications, Nov. 19, 2004, pp. 48-50, vol. 2005, No. 1.

Norman Pellet et al., "Mixed-Organic-Cation Perovskite Photovoltaics for Enhanced Solar-Light Harvesting," Angewandte Chemie, International Edition, Mar. 17, 2014, pp. 3151-3157, vol. 53, No. 12.

International Search Report of PCT/JP2015/061724 dated Jul. 14, 2015.

Communication dated Feb. 26, 2018, from State Intellectual Property Office of the P.R.C. in counterpart application No. 201580020398.8.

* cited by examiner

PHOTOELECTRIC CONVERSION ELEMENT, SOLAR CELL USING THE SAME, AND METHOD FOR MANUFACTURING PHOTOELECTRIC CONVERSION ELEMENT

CROSS-REFERENCE TO RELATED APPLICATIONS

This application is a Continuation of PCT International Application No. PCT/JP2015/061724 filed on Apr. 16, 2015, which claims priority under 35 U.S.C. § 119 (a) to Japanese Patent Application No. JP2014-086642, filed on Apr. 18, 2014, and JP2015-057611, filed on Mar. 20, 2015. Each of the above applications is hereby expressly incorporated by reference, in its entirety, into the present application.

BACKGROUND OF THE INVENTION

1. Field of the Invention

The present invention relates to a photoelectric conversion element, a solar cell using the same, and a method for manufacturing a photoelectric conversion element.

2. Description of the Related Art

Photoelectric conversion elements are used in a variety of optical sensors, copiers, solar cells, and the like. It is anticipated that solar cells will be actively put into practical use as cells using non-exhaustible solar energy. Among them, active research and development is underway regarding dye sensitized solar cells in which an organic coloring agent, a Ru bipyridyl complex, or the like is used as a sensitizer, and the photoelectric conversion efficiency thereof reaches approximately 11%.

Meanwhile, in recent years, there have been reports of research results that solar cells in which a metal halide is used as a compound having a perovskite-type crystal structure (perovskite compound) are capable of achieving a relatively high conversion efficiency, and these solar cells have been attracting attention.

For example, KR10-1172374B describes a solar cell comprising a photosensitive layer having a perovskite represented by $CH_3NH_3MX_3$ (M represents Pb or Sn, and X represents a halogen atom) and an electrolyte layer made of an electrolytic solution.

In addition, WO2013/126385A1 describes a compound including a monovalent organic cation such as a methylammonium cation or a guanidium cation as an A/M/X metal halide for photoluminescence.

Furthermore, Angew. Chem. Int. Ed. 2014, 53, p. 3151 to 3157 describes a photovoltaic device in which a perovskite: $APbI_3$ including a mixture of a formamidinium cation and a methylammonium cation as a cation A is used.

As described above, solar cells in which a perovskite compound is used have produced a certain result in terms of improvement in the photoelectric conversion efficiency. However, these solar cells have just been developed, and thus there is only an insufficient amount of research and studies regarding cell performance.

In such a situation, evaluations and studies have been made regarding the cell performance of solar cells comprising a photosensitive layer formed using a perovskite compound, and consequently, it has been found that the degree of cell performance degradation in a high-temperature and humidity environment significantly fluctuates among solar cells (the moisture-heat resistance varies) and cell performance is not sufficiently stable in a case in which solar cells are envisioned being used in a high-temperature and humidity environment such as outdoors.

Here, the high-temperature and humidity environment refers to an envisioned solar cell operation environment, is not particularly limited, and is, for example, an environment of a temperature in a range of 40° C. to 85° C. and a relative humidity in a range of 50% to 85%.

Therefore, an object of the present invention is to provide a photoelectric conversion element which has a moisture-heat resistance that varies only to a small extent and exhibits stable cell performance and a solar cell using the same. In addition, another object of the present invention is to provide a method for manufacturing a photoelectric conversion element exhibiting stable cell performance.

SUMMARY OF THE INVENTION

As a result of a variety of studies regarding solar cells for which a perovskite compound is used as a light absorber (hereinafter, also referred to as perovskite sensitized solar cells), the present inventors found that the moisture-heat resistance of the perovskite sensitized solar cells is affected by the structure, properties, and the like of perovskite-type crystals. As a result of additional studies, the present inventors found that, when a photosensitive layer is provided using a perovskite compound including two kinds of specific organic ammonium cation, it is possible to reduce the fluctuation range of the degree of the cell performance degradation in a high-temperature and humidity environment, and stable cell performance is exhibited. The present invention has been completed on the basis of the above-described findings.

That is, the objects are achieved by means of the following means.

<1> A photoelectric conversion element comprising: a first electrode having a photosensitive layer including a light absorber on a conductive support; and a second electrode facing the first electrode, in which the light absorber includes a compound having a perovskite-type crystal structure having an organic cation represented by Formula (IA) below, a cation of a metallic atom, and an anion that is an anionic atom or atomic group,

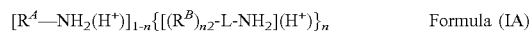
Formula (IA)

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying $0<n<1.00$,

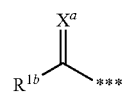
Formula (2)

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA).

<2> The photoelectric conversion element according to <1>, in which the compound having the perovskite-type crystal structure is represented by Formula (I) below, $$A_aM_mX_x \quad \text{Formula (I)}$$

in the formula, A represents a cationic organic group, M represents a metallic atom, X represents an anionic atom or atomic group, a represents 1 or 2, m represents 1, and a, m, and x satisfy a+2m=x.

<3> The photoelectric conversion element according to <1> or <2>, in which all of $R^1$, $R^2$, and $R^3$ are hydrogen atoms.

<4> The photoelectric conversion element according to any one of <1> to <3>, in which n represents a numerical value satisfying $0.10 \leq n \leq 0.50$.

<5> The photoelectric conversion element according to any one of <1> to <4>, in which n represents a numerical value satisfying $0.15 \leq n \leq 0.30$.

<6> The photoelectric conversion element according to any one of <1> to <5>, in which L has at least one group selected from the group consisting of groups represented by Formula L-1 to Formula L-9 below,

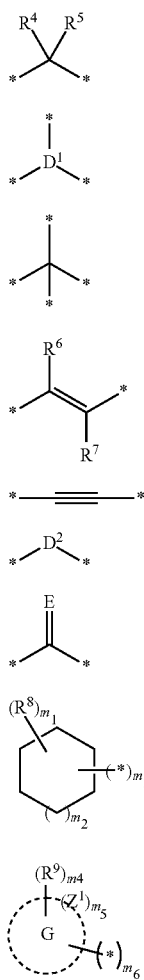

in the formulae, * represents a linking location to $R^B$, $NH_2$, or groups represented by the above-illustrated formulae, $D^1$ represents a nitrogen atom or $CR^{10}$, $D^2$ represents an oxygen atom, a sulfur atom, or $NR^{11}$, E represents an oxygen atom, a sulfur atom, or $NR^{12}$, a ring G represents an aryl ring or a heteroaryl ring, $Z^1$ represents a hetero atom or $NR^{13}$, $R^8$ and $R^9$ each independently represent a substituent, $R^4$ to $R^7$ and $R^{10}$ to $R^{13}$ each independently represent a hydrogen atom or a substituent, m1, m2, m4, and m5 each independently represent an integer of 0 or more, and m3 and m6 each independently represent an integer of 2 or more.

<7> The photoelectric conversion element according to any one of <1> to <6>, in which L has at least one group selected from the group consisting of groups represented by Formulae L-2, L-3, L-10, and L-11 below,

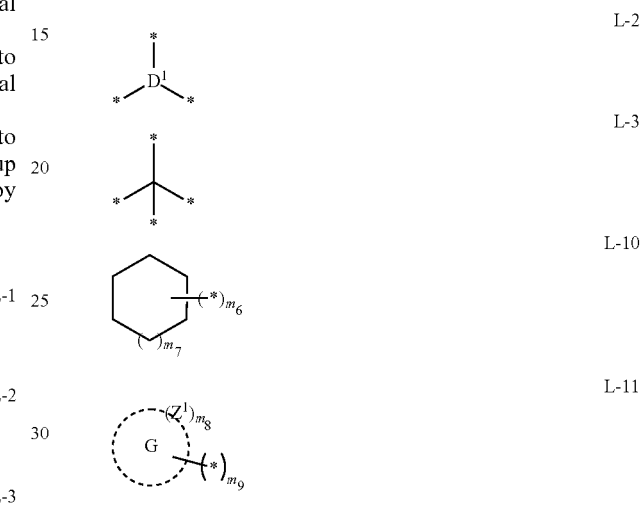

in the formulae, * represents a linking location to $R^B$, $NH_2$ or groups represented by the above-illustrated formulae, $D^1$ represents a nitrogen atom or $CR^{10}$, a ring G represents an aryl ring or a heteroaryl ring, $Z^1$ represents a hetero atom or $NR^{13}$, $R^{10}$ and $R^{13}$ each independently represent a hydrogen atom or a substituent, m5 and m7 each independently represent an integer of 0 or more, and m8 and m9 each independently represent an integer of 3 or more.

<8> The photoelectric conversion element according to any one of <1> to <7>, in which $R^4$ is an alkyl group substituted with a halogen atom.

<9> The photoelectric conversion element according to any one of <1> to <8>, in which n2 is an integer of 2 or more.

<10> The photoelectric conversion element according to any one of <1> to <9>, in which the cation of a metallic atom is at least one metallic cation selected from the group consisting of lead and tin.

<11> The photoelectric conversion element according to any one of <1> to <10>, in which the anion is an anion of a halogen atom.

<12> The photoelectric conversion element according to any one of <1> to <11>, further comprising: a porous layer between the conductive support and the photosensitive layer.

<13> The photoelectric conversion element according to any one of <1> to <12>, further comprising: a hole transportation layer between the first electrode and the second electrode.

<14> A solar cell using the photoelectric conversion element according to any one of <1> to <13>.

<15> A method for manufacturing a photoelectric conversion element, comprising: bringing a layer which is provided on a conductive support and in which a photosensitive layer is to be formed into contact with liquid including a compound having a perovskite-type crystal structure including an organic cation represented by Formula (IA) below, a cation of a metallic atom, and an anion that is an anionic atom or atomic group,

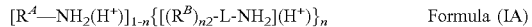  Formula (IA)

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying 0<n<1.00,

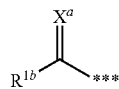  Formula (2)

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA).

In the present specification, regarding the expression of the respective formulae, there are cases in which a part of the formula is expressed as a rational formula in order for understanding of the chemical structure of a compound. Accordingly, in the respective formulae, partial structures are called groups (substituents), ions, atoms, or the like; however, in the present specification, there are cases in which the partial structures will refer to element groups or elements constituting groups (substituents) or ions represented by the above-illustrated formulae in addition to groups (substituents), ions, atoms, or the like.

In the present specification, the expression of compounds (including complexes and coloring agents) is used to indicate not only the compounds themselves but also salts or ions thereof. In addition, the expression indicates compounds and the like having a structure that is partially modified within the intended effects. Furthermore, compounds in which it is not clear whether the compounds are substituted or unsubstituted compounds may have an arbitrary substituent as long as a desired effect is exhibited. What has been described above shall also apply to substituents, linking groups, and the like (hereinafter, substituents and the like).

In the present specification, when there are multiple substituents and the like expressed using a specific reference symbol or multiple substituents and the like are specified at the same time, the respective substituents and the like may be identical to or different from each other unless particularly otherwise described. What has been described above shall also apply to the specification regarding the number of substituents and the like. In addition, when multiple substituents and the like are close to each other (for example, are adjacent to each other), the substituents and the like may be linked to each other and thus form a ring unless particularly otherwise described. In addition, rings, for example, alicycles, aromatic rings, and hetero rings may be further fused together and thus form a fused ring.

In addition, in the present specification, numerical ranges expressed using "to" include numerical values before and after the "to" as the lower limit value and the upper limit value.

Due to the present invention, it is possible to provide a photoelectric conversion element which has a moisture-heat resistance that varies only to a small extent among products and exhibits stable cell performance and a solar cell using the same.

In addition, it is possible to provide a method for manufacturing the above-described photoelectric conversion element exhibiting stable cell performance.

The above-described and other characteristics and advantages of the present invention will be further clarified from the following description with appropriate reference to the accompanying drawings.

DESCRIPTION OF THE PREFERRED EMBODIMENTS

<<Photoelectric Conversion Element>>

A photoelectric conversion element of the present invention includes a first electrode having a conductive support and a photosensitive layer provided on the conductive support and a second electrode facing the first electrode. The photosensitive layer includes a compound (also referred to as a perovskite-type light absorber) having a perovskite-type crystal structure having an organic cation represented by Formula (IA), a cation of a metallic atom, and an anion that is an anionic atom or atomic group.

In the present invention, the photosensitive layer being provided on the conductive support means an aspect in which the photosensitive layer is provided in contact with the surface of the conductive support (directly provided) or an aspect in which the photosensitive layer is provided above the surface of the conductive support through another layer.

In the aspect in which the photosensitive layer is provided above the surface of the conductive support through another layer, the layer that is provided between the conductive support and the photosensitive layer is not particularly limited as long as the layer does not degrade the cell performance of the solar cell. Examples thereof include porous layers, blocking layers, and the like.

Figure 4:
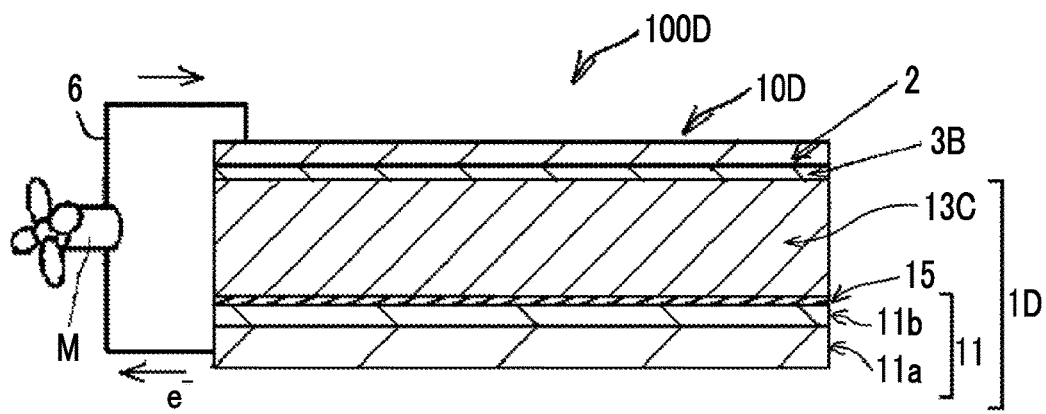
FIG. 4 is a cross sectional view schematically illustrating still another preferred aspect of the photoelectric conversion element of the present invention.
Figure 5:
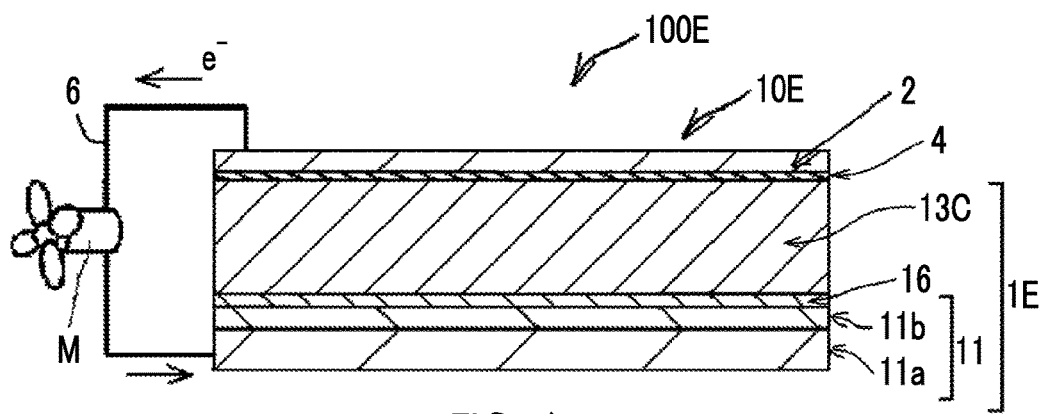
FIG. 5 is a cross sectional view schematically illustrating still another preferred aspect of the photoelectric conversion element of the present invention.

In the present invention, example of the aspect in which the photosensitive layer is provided above the surface of the conductive support through another layer include an aspect in which the photosensitive layer is provided on the surface of a porous layer in a thin film shape or the like (refer to FIG. 1), an aspect in which the photosensitive layer is provided on the surface of a porous layer in a thick film shape (refer to FIGS. 2 and 6), an aspect in which the photosensitive layer is provided on the surface of a blocking layer in a thin film shape and an aspect in which the photosensitive layer is provided on the surface of a blocking layer in a thick film shape (refer to FIG. 3), an aspect in which the photosensitive layer is provided on the surface of an electron transportation layer in a thin film shape or a thick film shape (refer to FIG. 4), and an aspect in which the photosensitive layer is provided on the surface of a hole transportation layer in a thin film shape or a thick film shape (refer to FIG. 5). The photosensitive layer may be provided in a linear shape or a dispersed pattern, but is preferably provided in a film shape.

There is no particular limitation regarding constitutions unless particularly specified in the present invention, and well-known constitutions relating to photoelectric conversion elements and solar cells can be employed for the photoelectric conversion element of the present invention. The respective layers constituting the photoelectric conversion element of the present invention are designed according to their purposes and may have a monolayer form or a multilayer form. For example, it is also possible to provide the porous layer between the conductive support and the photosensitive layer (refer to FIGS. 1, 2 and 6).

Hereinafter, preferred aspects of the photoelectric conversion element of the present invention will be described.

In FIGS. 1 to 6, the same reference symbol indicates the same constituent element (member).

Figure 1:
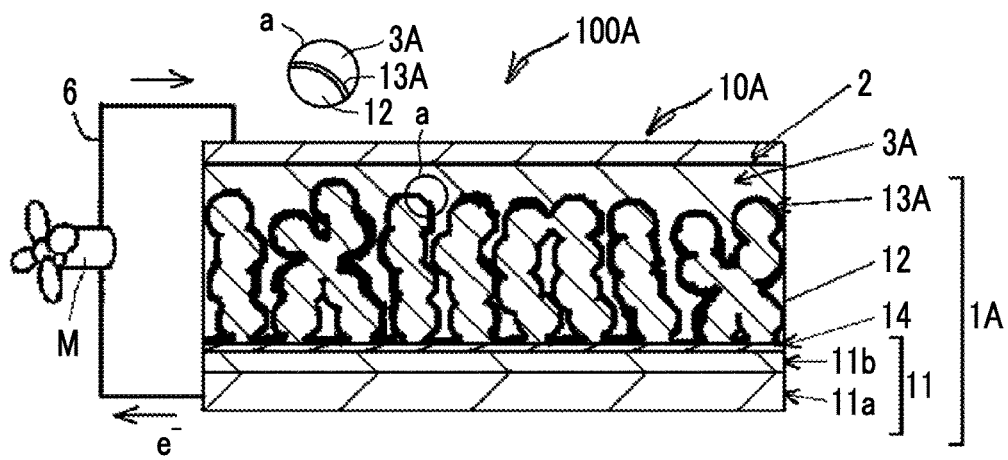
FIG. 1 is a cross sectional view schematically illustrating a preferred aspect of a photoelectric conversion element of the present invention including an enlarged view of a circled portion in a layer.
Figure 2:
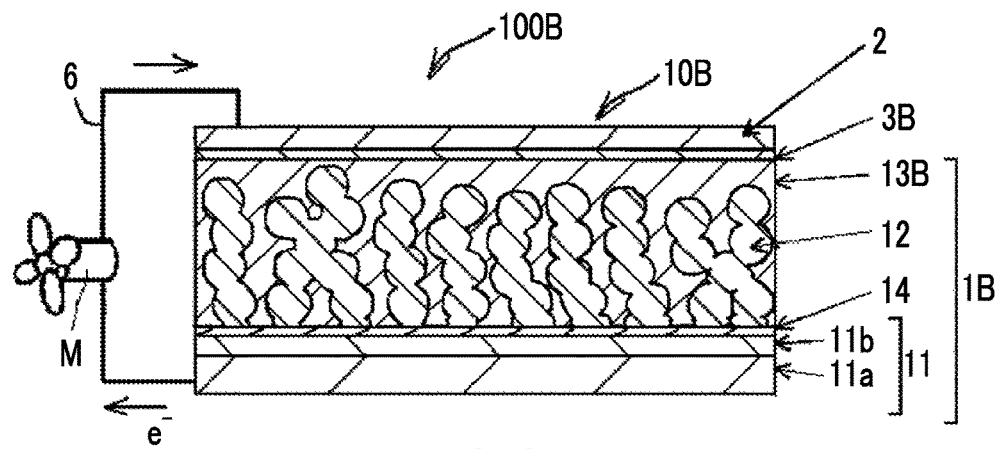
FIG. 2 is a cross sectional view schematically illustrating a preferred aspect of the photoelectric conversion element of the present invention including a thick photosensitive layer.
Figure 6:
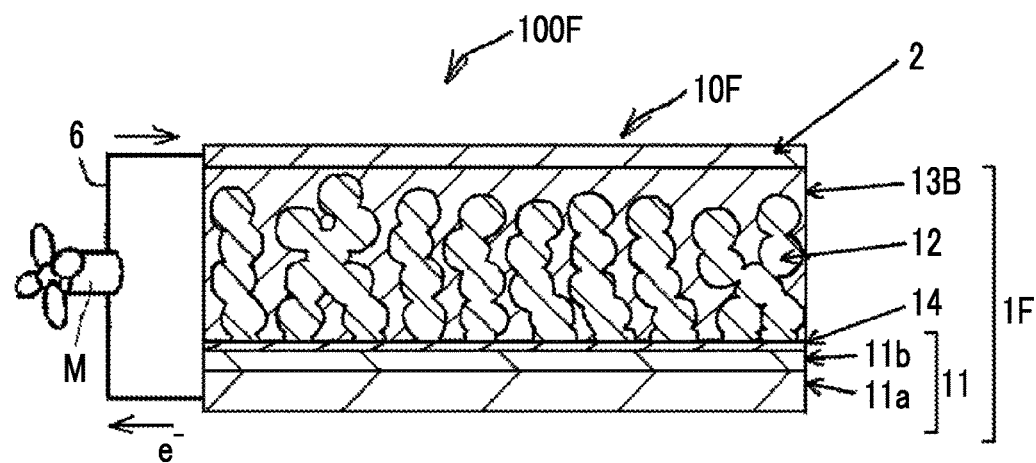
FIG. 6 is a cross sectional view schematically illustrating still another preferred aspect of the photoelectric conversion element of the present invention.

Meanwhile, in FIGS. 1, 2, and 6, fine particles forming a porous layer 12 are illustrated in an enlarged manner. These fine particles are preferably jammed with each other (accumulated or in close contact with each other) in the horizontal direction and the vertical direction with respect to a conductive support 11 and thus form a porous structure.

In the present specification, in the case of being simply mentioned, a photoelectric conversion element 10 refers to photoelectric conversion elements 10A to 10F. unless particularly otherwise mentioned. This also shall apply to a system 100 and a first electrode 1. In addition, in the case of being simply mentioned, a photosensitive layer 13 refers to photosensitive layers 13A to 13C unless particularly otherwise mentioned. Similarly, in the case of a hole transportation layer 3, the layer refers to hole transportation layers 3A and 3B unless particularly otherwise mentioned.

Examples of the preferred aspects of the photoelectric conversion element of the present invention include the photoelectric conversion element 10A illustrated in FIG. 1. A system 100A illustrated in FIG. 1 is a system to which the photoelectric conversion element 10A is applied as a cell that causes action means M (for example, an electric motor) to operate through an external circuit 6.

The photoelectric conversion element 10A includes a first electrode 1A, a second electrode 2, and the hole transportation layer 3A.

The first electrode 1A includes the conductive support 11 made up of a support 11a and a transparent electrode 11b, the porous layer 12, and the photosensitive layer 13A provided as a perovskite-type light absorber on the surface of the porous layer 12 as schematically illustrated in an enlarged cross sectional region a obtained by enlarging the cross sectional region a in FIG. 1. In addition, a blocking layer 14 is provided on the transparent electrode 11b, and the porous layer 12 is formed on the blocking layer 14. In the photoelectric conversion element 10A including the porous layer 12 as described above, since the surface area of the photosensitive layer 13A increases, it is assumed that the charge separation and charge transfer efficiency improves.

The photoelectric conversion element 10B illustrated in FIG. 2 is a schematic illustration of a preferred aspect in which the photosensitive layer 13A in the photoelectric conversion element 10A illustrated in FIG. 1 is provided to be thick. In this photoelectric conversion element 10B, the hole transportation layer 3B is provided to be thin. The photoelectric conversion element 10B is different from the photoelectric conversion element 10A illustrated in FIG. 1 in terms of the film thicknesses of the photosensitive layer 13B and the hole transportation layer 3B and is constituted in the same manner as the photoelectric conversion element 10A except for the film thicknesses.

Figure 3:
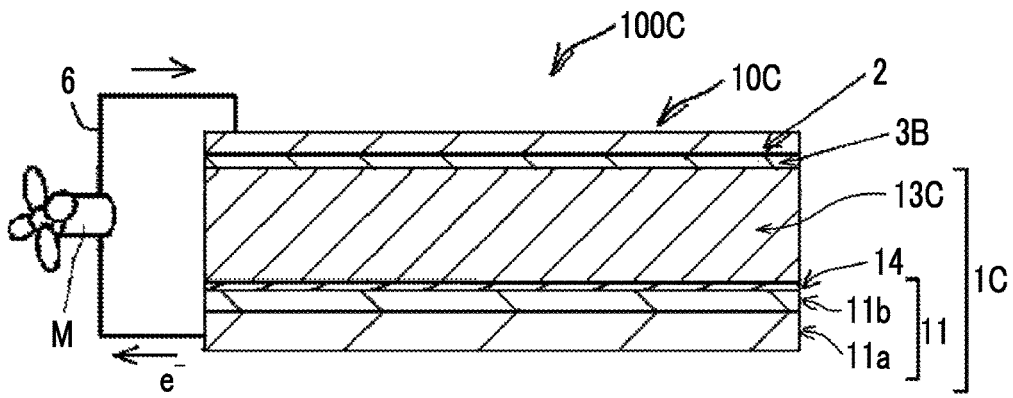
FIG. 3 is a cross sectional view schematically illustrating another preferred aspect of the photoelectric conversion element of the present invention.

The photoelectric conversion element 10C illustrated in FIG. 3 is a schematic illustration of another preferred aspect of the photoelectric conversion element of the present invention. The photoelectric conversion element 10C is different from the photoelectric conversion element 10B illustrated in FIG. 2 in terms of the porous layer 12 being not provided and is constituted in the same manner as the photoelectric conversion element 10B except for the porous layer. That is, in the photoelectric conversion element 10C, the photosensitive layer 13C is formed on the surface of the blocking layer 14 in a thick film shape. In the photoelectric conversion element 10C, it is also possible to provide the hole transportation layer 3B to be thick like the hole transportation layer 3A.

The photoelectric conversion element 10D illustrated in FIG. 4 is a schematic illustration of still another preferred aspect of the photoelectric conversion element of the present invention. The photoelectric conversion element 10D is different from the photoelectric conversion element 10C illustrated in FIG. 3 in terms of an electron transportation layer 15 being provided instead of the blocking layer 14 and is constituted in the same manner as the photoelectric conversion element 10C except for the electron transportation layer. A first electrode 1D includes the conductive support 11 and the electron transportation layer 15 and the photosensitive layer 13C which are sequentially formed on the conductive support 11. The photoelectric conversion element 10D is preferred since the respective layers are formed of an organic material. Therefore, the productivity of the photoelectric conversion element improves, and furthermore, it becomes possible to reduce the thickness of the photoelectric conversion element or make the photoelectric conversion element flexible.

The photoelectric conversion element 10E illustrated in FIG. 5 is a schematic illustration of still another preferred aspect of the photoelectric conversion element of the present invention. A system 100E including the photoelectric conversion element 10E is a system to which the photoelectric conversion element is applied as a cell like the system 100A.

The photoelectric conversion element 10E includes a first electrode 1E, the second electrode 2, and an electron transportation layer 4 between the first electrode 1E and the second electrode 2. The first electrode 1E includes the conductive support 11 and a hole transportation layer 16 and the photosensitive layer 13C which are sequentially formed on the conductive support 11. The photoelectric conversion element 10E is preferred since the respective layers are formed of an organic material as in the photoelectric conversion element 10D.

The photoelectric conversion element 10F illustrated in FIG. 6 is a schematic illustration of still another preferred aspect of the photoelectric conversion element of the present invention. The photoelectric conversion element 10F is different from the photoelectric conversion element 10B illustrated in FIG. 2 in terms of the hole transportation layer 3B being not provided and is constituted in the same manner as the photoelectric conversion element 10B except for the hole transportation layer.

In the present invention, the system 100 to which the photoelectric conversion element 10 is applied functions as a solar cell in the following manner.

That is, in the photoelectric conversion element 10, light that has passed through the conductive support 11 or the second electrode 2 and has entered the photosensitive layer 13 excites a light absorber. The excited light absorber has high-energy electrons and is capable of emitting the electrons. The light absorber which has emitted high-energy electrons turns into an oxidant.

In the photoelectric conversion elements 10A to 10D and 10F, electrons emitted from the light absorber migrate in the light absorber and reach the conductive support 11. The electrons which have reached the conductive support 11 do their work in the external circuit 6 and then return to the photosensitive layer 13 through the second electrode 2 (in a case in which the hole transportation layer 3 is provided, through the hole transportation layer 3 as well). The light absorber is reduced by the electrons which had returned to the photosensitive layer 13.

On the other hand, in the photoelectric conversion element 10E, electrons emitted from the light absorber reach the second electrode 2 through the electron transportation layer 4 from the photosensitive layer 13C, do their work in the external circuit 6, and then return to the photosensitive layer 13 through the conductive support 11. The light absorber is reduced by the electrons which had returned to the photosensitive layer 13.

The system 100 functions as a solar cell due to the above-described cycle of the excitement of the light absorber and electron migration being repeated in the photoelectric conversion element 10.

In the photoelectric conversion elements 10A to 10D and 10F, the flow direction of electrons from the photosensitive layer 13 to the conductive support 11 varies depending on the presence or absence, kind, and the like of the porous layer 12. In the photoelectric conversion element 10 of the present invention, electron conduction in which electrons migrate in the light absorber occurs. Therefore, in a case in which the porous layer 12 is provided, the porous layer 12 can be formed of an insulating body other than semiconductors in the related art. In a case in which the porous layer 12 is formed of a semiconductor, electron conduction in which electrons migrate inside or between semiconductor fine particles in the porous layer 12 also occurs. On the other hand, in a case in which the porous layer 12 is formed of an insulating body, electron conduction in the porous layer 12 does not occur. In a case in which the porous layer 12 is formed of an insulating body, when aluminum oxide ($Al_2O_3$) fine particles are used as insulating body fine particles, a relatively high electromotive force (Voc) is obtained.

In a case in which the blocking layer 14, as other layers, is formed of a conductor or a semiconductor as well, electron conductor occurs in the blocking layer 14.

In addition, electron conduction also occurs in the electron transportation layer 15.

The photoelectric conversion element and the solar cell of the present invention are not limited to the above-described preferred aspects, and the constitutions and the like of the respective aspects can be appropriately combined together within the scope of the gist of the present invention. For example, the photoelectric conversion element 10C or 10D can also be provided with a constitution in which the hole transportation layer 3B is not provided like the photoelectric conversion element 10F.

In the present invention, materials and the respective members which are used in the photoelectric conversion element and the solar cell can be prepared using ordinary methods except for materials and members that are specified in the present invention. For example, regarding perovskite sensitized solar cells, it is possible to refer to KR10-1172374B, WO2013/126385A, Angew. Chem. Int. Ed. 2014, 53, p. 3151 to 3157, J. Am. Chem. Soc., 2009, 131 (17), pp. 6050 and 6051, and Science, 338, p. 643 (2012). In addition, regarding materials and individual members which are used in dye sensitized solar cells, it is possible to refer to the following documents. For example, for dye sensitized solar cells, it is possible to refer to JP2001-291534A, the specification of U.S. Pat. No. 4,927,721A, the specification of U.S. Pat. No. 4,684,537A, the specification of U.S. Pat. No. 5,084,365A, the specification of U.S. Pat. No. 5,350,644A, the specification of U.S. Pat. No. 5,463,057A, the specification of U.S. Pat. No. 5,525,440A, JP1995-249790A (JP-H07-249790A), JP2004-220974A, and JP2008-135197A.

Hereinafter, main members constituting the solar cell and functions thereof will be roughly described.

<First Electrode 1>

The first electrode 1 includes the conductive support 11 and the photosensitive layer 13 and functions as a working electrode in the photoelectric conversion element 10.

The first electrode 1 preferably includes at least one layer of the porous layer 12, the blocking layer 14, the electron transportation layer 15, and the hole transportation layer 16 as illustrated in FIGS. 1 to 6.

The first electrode 1 preferably includes at least the blocking layer 14 in terms of short circuit prevention and more preferably includes the porous layer 12 and the blocking layer 14 in terms of light absorption efficiency and short circuit prevention.

In addition, the first electrode 1 preferably includes the electron transportation layer 15 or the hole transportation layer 16 which is formed of an organic material in terms of improvement of the productivity of the photoelectric conversion element, thickness reduction, or the photoelectric conversion element becoming flexible.

—Conductive Support 11—

The conductive support 11 is not particularly limited as long as the conductive support has conductivity and is capable of supporting the photosensitive layer 13 or the like. The conductive support 11 preferably has a constitution in which the conductive support is formed of a conductive material, for example, metal or a constitution in which the glass or plastic support 11a and the transparent electrode 11b formed on the surface of the support 11a as a conductive film are provided.

Among these, the conductive support 11 in which the transparent electrode 11b is formed by applying a conductive metallic oxide onto the surface of the glass or plastic support 11a as illustrated in FIGS. 1 to 6 is more preferred. Examples of the support 11a formed of plastic include transparent polymer films described in Paragraph 0153 of JP2001-291534A. As a material used to form the support 11a, it is possible to use, in addition to glass or plastic, ceramics (JP2005-135902A) or conductive resins (JP2001-

160425A). The metallic oxide is preferably tin oxide (TO) and particularly preferably an indium-tin oxide (a tin-doped indium oxide, ITO) or a fluorine-doped tin oxide such as a fluorine-doped tin oxide (FTO). At this time, the amount of the metallic oxide applied is preferably in a range of 0.1 to 100 g per the surface area of the support 11a of square meter. In a case in which the conductive support 11 is used, light preferably enters the conductive support through the support 11a side.

The conductive support 11 is preferably substantially transparent. In the present invention, "being substantially transparent" means that the transmittance of light (having a wavelength in a range of 300 to 1,200 nm) is 10% or higher, preferably 50% or higher, and particularly preferably 80% or higher.

The thicknesses of the support 11a and the conductive support 11 are not particularly limited and are set to appropriate thicknesses. For example, the thicknesses are preferably in a range of 0.01 μm to 10 mm, more preferably in a range of 0.1 μm to 5 mm, and particularly preferably in a range of 0.3 μm to 4 mm.

In a case in which the transparent electrode 11b is provided, the film thickness of the transparent electrode 11b is not particularly limited and is, for example, preferably in a range of 0.01 to 30 μm, more preferably in a range of 0.03 to 25 μm, and particularly preferably in a range of 0.05 to 20 μm.

The conductive support 11 or the support 11a may have a light management function on the surface. For example, the conductive support 11 or the support 11a may have on the surface an antireflection film obtained by alternately laminating high-refractive index films and low-refractive index oxide films which is described in JP2003-123859A or may have a light guide function described in JP2002-260746A.

—Blocking Layer 14—

In the present invention, as in the photoelectric conversion elements 10A to 10C and 10F, the blocking layer 14 is preferably provided on the surface of the transparent electrode 11b, that is, between the conductive support 11 and the porous layer 12, the photosensitive layer 13, the hole transportation layer 3, or the like.

In the photoelectric conversion element and the solar cell, for example, when the photosensitive layer 13 or the hole transportation layer 3 and the transparent electrode 11b or the like are electrically connected to each other, reverse currents are generated. The blocking layer 14 performs a function of preventing these reverse currents. The blocking layer 14 is also referred to as a short circuit prevention layer.

It is also possible to make the blocking layer 14 function as a scaffold for carrying and supporting the light absorber.

The blocking layer 14 may also be provided in a case in which the photoelectric conversion element includes an electron transportation layer. For example, in the case of the photoelectric conversion element 10D, the blocking layer may be provided between the conductive support 11 and the electron transportation layer 15, and in the case of the photoelectric conversion element 10E, the blocking layer may be provided between the second electrode 2 and the electron transportation layer 4.

A material used to form the blocking layer 14 is not particularly limited as long as the material is capable of performing the above-described function, but is preferably a substance transmitting visible light and an insulating substance with respect to the conductive support 11 (the transparent electrode 11b) and the like. The "insulating substance with respect to the conductive support 11 (the transparent electrode 11b)" specifically refers to a compound having an energy level of the conduction band which is equal to or higher than the energy level of the conduction band of a material used to form the conductive support 11 (a metallic oxide used to form the transparent electrode 11b) and is lower than the energy level of the conduction band of a material constituting the porous layer 12 or the ground state of the light absorber (n-type semiconductor compound).

Examples of a material used to form the blocking layer 14 include silicon oxide, magnesium oxide, aluminum oxide, calcium carbonate, cesium carbonate, polyvinyl alcohols, polyurethanes, and the like. In addition, the material may be a material that is ordinarily used as a photoelectric conversion material, and examples thereof include titanium oxide, tin oxide, zinc oxide, niobium oxide, tungsten oxide, and the like. Among these, titanium oxide, tin oxide, magnesium oxide, aluminum oxide, and the like are preferred.

The film thickness of the blocking layer 14 is preferably in a range of 0.001 to 10 μm, more preferably in a range of 0.005 to 1 μm, and particularly preferably in a range of 0.01 to 0.1 μm.

In the present invention, the film thicknesses of the respective layers can be measured by observing cross sections of the photoelectric conversion element 10 using a scanning electron microscope (SEM) or the like.

—Porous Layer 12—

In the present invention, as in the photoelectric conversion elements 10A, 10B, and 10F, the porous layer 12 is preferably provided on the transparent electrode 11b. In a case in which the photoelectric conversion element includes the blocking layer 14, the porous layer is preferably formed on the blocking layer 14.

The porous layer 12 is a layer that functions as a scaffold for carrying and supporting the photosensitive layer 13 on the surface. In solar cells, in order to increase the light absorption efficiency, it is preferable to increase the surface area of at least a portion receiving light such as sunlight, and it is preferable to increase the surface area of the porous layer 12 as a whole.

The porous layer 12 is preferably a fine particle layer having pores which is formed of fine particles of a material used to form the porous layer 12 being accumulated or in close contact with each other. The porous layer 12 may be a fine particle layer formed of two or more kinds of fine particles being accumulated together. When the porous layer 12 is a fine particle layer having pores, it is possible to increase the amount of the light absorber carried and supported (adsorption amount).

In order to increase the surface area of the porous layer 12, it is preferable to increase the surface area of individual fine particles that constitute the porous layer 12. In the present invention, the surface area of fine particles used to form the porous layer 12 in a state in which the fine particles are applied onto the conductive support 11 and the like is preferably 10 or more times and more preferably 100 or more times the projected area. The upper limit thereof is not particularly limited, but is, generally, approximately 5,000 times. Regarding the particle diameters of the fine particles used to form the porous layer 12, the average particle diameter of the diameters of equivalent circles of the projected areas is preferably in a range of 0.001 to 1 μm for the primary particle diameter. In a case in which the porous layer 12 is formed using a dispersoid of the fine particles, the average particle diameter of the fine particles is preferably in a range of 0.01 to 100 μm in terms of the average particle diameter in the dispersoid.

For the material used to form the porous layer 12, there is no particular limitation regarding conductivity, and thus the material may be an insulating body (insulating material), a conductive material, or a semiconductor (semi-conductive material).

As the material used to form the porous layer 12, it is possible to use, for example, chalcogenides (for example, oxides, sulfides, selenides, and the like) of metal, compounds having a perovskite-type crystal structure (except for perovskite compounds being used as light absorbers), oxides of silicon (for example, silicon dioxide and zeolite), or carbon nanotubes (including carbon nanowires, carbon nanorods, and the like).

The chalcogenides of metal are not particularly limited, and preferred examples thereof include individual oxides of titanium, tin, zinc, tungsten, zirconium, hafnium, strontium, indium, cerium, yttrium, lanthanum, vanadium, niobium, aluminum, or tantalum, cadmium sulfide, cadmium selenide, and the like. Examples of the crystal structure of the chalcogenides of metal include an anatase-type crystal structure, a brookite-type crystal structure, and a rutile-type crystal structure, and an anatase-type crystal structure and a brookite-type crystal structure are preferred.

The compounds having a perovskite-type crystal structure are not particularly limited, and examples thereof include transition metal oxides and the like. Examples thereof include strontium titanate, calcium titanate, barium titanate, lead titanate, barium zirconate, barium stannate, lead zirconate, strontium zirconate, strontium tantalate, potassium niobate, bismuth ferrite, barium strontium titanate, lanthanum barium titanate, calcium titanate, sodium titanate, and bismuth titanate. Among these, strontium titanate, calcium titanate, and the like are preferred.

The carbon nanotubes have a shape obtained by rolling a carbon film (graphene sheet) in a tubular shape. Carbon nanotubes are classified into single-walled carbon nanotubes (SWCNT) obtained by coiling one graphene sheet in a cylindrical shape, double-walled carbon nanotubes (DW-CNT) obtained by coiling two graphene sheets in a concentric shape, and multi-walled carbon nanotubes (MWCNT) obtained by coiling multiple graphene sheets in a concentric shape. As the porous layer 12, any carbon nanotubes can be used without any particular limitation.

Among these, the material used to form the porous layer 12 is preferably an oxide of titanium, tin, lead, zirconium, aluminum, or silicon or a carbon nanotube and more preferably titanium oxide or aluminum oxide.

The porous layer 12 may be formed of one or more of the chalcogenide of metal, the compound having a perovskite-type crystal structure, the oxide of silicon, or the carbon nanotube which have been described above.

The film thickness of the porous layer 12 is not particularly limited and is generally in a range of 0.05 to 100 µm and preferably in a range of 0.1 to 100 µm. In the case of being used as a solar cell, the film thickness is preferably in a range of 0.1 to 50 µm, more preferably in a range of 0.2 to 30 µm, and still more preferably in a range of 0.3 to 30 µm.

—Electron Transportation Layer 15—

In the present invention, as in the photoelectric conversion element 10D, the electron transportation layer 15 is preferably provided on the surface of the transparent electrode 11b.

The electron transportation layer 15 has a function of transporting electrons generated in the photosensitive layer 13 to the conductive support 11. The electron transportation layer 15 is formed of an electron-transporting material capable of exhibiting the above-described function. The electron-transporting material is not particularly limited and is preferably an organic material (organic electron-transporting material). Examples of the organic electron-transporting material include fullerene compounds such as [6,6]-phenyl-C61-butyric acid methyl ester ($PC_{61}BM$), perylene compounds such as perylene tetracarboxylic diimide (PTCDI), additionally, low-molecular-weight compounds such as tetracyanoquinodimethane (TCNQ), high-molecular-weight compounds, and the like.

The film thickness of the electron transportation layer 15 is not particularly limited and is preferably in a range of 0.001 to 10 µm and more preferably in a range of 0.01 to 1 µm.

—Hole Transportation Layer 16—

In the present invention, as in the photoelectric conversion element 10E, the hole transportation layer 16 is preferably provided on the surface of the transparent electrode 11b.

The hole transportation layer 16 is the same as the hole transportation layer 3 described below except for the location of the hole transportation layer being formed.

—Photosensitive Layer (Light-Absorbing Layer) 13—

As illustrated in FIGS. 1 to 6, the photosensitive layer 13 is preferably provided on the surfaces (including the surfaces in recesses portions in a case in which surfaces provided with the photosensitive layer 13 are uneven) of the respective layers of the porous layer 12 (in the photoelectric conversion elements 10A, 10B, and 10F), the blocking layer 14 (in the photoelectric conversion element 10C), the electron transportation layer 15 (in the photoelectric conversion element 10D), and the hole transportation layer 16 (in the photoelectric conversion element 10E) using a compound having a perovskite-type crystal structure having the organic cation represented by Formula (IA), a cation of a metallic atom, and an anion that is an anionic atom or atomic group as a light absorber.

In the present invention, the light absorber needs to contain at least one perovskite compound specified above and may contain two or more perovskite compounds. In addition, the light absorber may contain a light absorber other than the perovskite compound together with the perovskite compound. Examples of the light absorber other than the perovskite compound include metallic complex coloring agents and organic coloring agents. At this time, the ratio between the perovskite compound and the light absorber other than the perovskite compound is not particularly limited.

The photosensitive layer 13 may be a single layer or a laminate of two or more layers. In a case in which the photosensitive layer 13 is a laminate structure of two or more layers, the laminate structure may be a laminate structure formed by laminating layers made of mutually different light absorbers or a laminate structure having an interlayer including a hole-transporting material between the photosensitive layer and the photosensitive layer.

Possible aspects of the photosensitive layer 13 are as described above, and the photosensitive layer 13 is preferably provided on the surface of the porous layer 12 or the blocking layer 14 so that excited electrons flow into the conductive support 11. At this time, the photosensitive layer 13 may be provided on the entire surface or on a part of the surface, and, in a case in which the porous layer 12 is used, the photosensitive layer may be provided inside pores in the porous layer 12.

The film thickness of the photosensitive layer 13 is appropriately set according to the possible aspects of the photosensitive layer and is not particularly limited. The film thickness of the photosensitive layer 13 is, for example, preferably in a range of 0.001 to 100 µm, more preferably in a range of 0.01 to 10 µm, and particularly preferably in a range of 0.01 to 5 µm.

In a case in which the porous layer 12 is provided, the total film thickness including the film thickness of the porous layer 12 is preferably 0.01 µm or more, more preferably 0.05 µm or more, still more preferably 0.1 µm or more, and particularly preferably 0.2 µm or more. In addition, the total film thickness is preferably 100 µm or less, more preferably 50 µm or less, still more preferably 30 µm or less, and particularly preferably 3 µm or less. The total film thickness can be set in a range obtained by appropriately combining the above-described values. For example, the total film thickness including the film thickness of the porous layer 12 is preferably in a range of 0.1 to 100 µm, more preferably 0.1 µm to 50 µm, and particularly preferably in a range of 0.2 to 3 µm. Here, in a case in which the photosensitive layer 13 has a thin film shape as illustrated in FIG. 1, the film thickness of the photosensitive layer 13 refers to the distance between the interface with the porous layer 12 and the interface with the hole transportation layer 3 described below in a direction perpendicular to the surface of the porous layer 12.

In the photoelectric conversion element 10, the total film thickness of the porous layer 12, the photosensitive layer 13, and the hole transportation layer 3 is not particularly limited, but is, for example, preferably 0.01 µm or more, more preferably 0.05 µm or more, still more preferably 0.1 µm or more, and particularly preferably 0.3 µm or more. In addition, the total film thickness is preferably 200 µm or less, more preferably 50 µm or less, still more preferably 30 µm or less, and particularly preferably 5 µm or less. The total film thickness can be set in a range obtained by appropriately combining the above-described values.

Meanwhile, in FIG. 2, the photosensitive layer has a larger thickness than the photosensitive layer illustrated in FIG. 1, and the perovskite-type light absorber represented by Formula (I) which is used in the present invention is a substance being, similar to other perovskite compounds, capable of serving as a hole-transporting material.

The amount of the perovskite-type light absorber used needs to be an amount at which at least a part of the surface of at least the porous layer 12 or the blocking layer 14 on which light is incident can be covered with the light absorber and is preferably an amount at which the entire surface can be covered with the light absorber.

In the photosensitive layer 13, the content of the perovskite compound is generally in a range of 1 to 100% by mass.

Hereinafter, the light absorber that is used in the present invention will be described.

The photosensitive layer 13 contains at least one perovskite compound having a cationic organic group, a metallic atom, and an anionic atom or atomic group as a light absorber.

The cationic organic group, the metallic atom, and the anionic atom or atomic group in the perovskite compound are present as individual constituent ions of the organic cation (for convenience, in some cases, referred to as the organic cation A), the metallic atom (for convenience, in some cases, referred to as the cation M), and an anion (for convenience, in some cases, referred to as the anion X) respectively in the perovskite-type crystal structure.

In the present invention, the cationic organic group refers to an organic group having a property of becoming an organic cation in the perovskite-type crystal structure, and the anionic atom or atomic group refers to an atom or atomic group having a property of becoming anionic in the perovskite-type crystal structure.

The perovskite compound that is used in the present invention is a compound having a perovskite-type crystal structure including the organic cation represented by Formula (IA), a cation of a metallic atom, and an anion that is an anionic atom or atomic group.

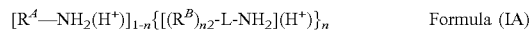

Formula (IA)

In the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)^{2L}$ is a group different from $R^A$, and n represents a numerical value satisfying $0<n<1.00$.

Formula (2)

In the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA).

The reason that the variation in the moisture-heat resistance can be reduced when a perovskite compound in which an organic cation constituting the perovskite-type crystal structure is the organic cation represented by Formula (IA) is used as the perovskite compound used to form the photosensitive layer 13 is not yet clear, but is assumed as described below. That is, in the perovskite compound, when two mutually different organic ammonium cations of an organic ammonium cation having one amino group and an organic ammonium cation having two or more amino groups are used, the perovskite-type crystal structure is stabilized due to the amino groups in the organic ammonium cation having two or more amino groups in the presence of the organic ammonium cation having one amino group, and it is not easy for defects to be generated in the crystal lattices. As a result, it is considered that the interface states with layers adjacent to the photosensitive layer 13 become uniform, performance degradation caused by deterioration attributed to moisture or heat at a high temperature and a high humidity on the interfaces or in crystals is relaxed by other normal portions due to an effect that is constant at all times, whereby variation is reduced. In addition, crystal portions including defects have a significant influence on performance degradation caused by moisture or heat that intrudes into the crystal structure when the crystal portions are placed at a high temperature and a high humidity, and thus it is considered that a decrease in the number of defects due to the present invention can be a reason for variation reduction.

In addition, the excellent photoelectric conversion efficiency exhibited by the organic ammonium cation having one amino group also does not decrease due to the presence of the organic ammonium cation having two or more amino groups, and the cell performance of perovskite sensitized solar cells is maintained.

In the light absorber that is used in the present invention, as described above, two kinds of cation represented by Formula (IA) are jointly used as the organic cation constituting the perovskite-type crystal structure. That is, one cation is [$R^A$—$NH_2(H^+)$], and the other cation is {[($R^B$)$_{n2}$-L-$NH_2$]($H^+$)}.

In the present invention, the perovskite compound needs to have two organic cations described above as the light absorber as a whole. The perovskite compound may be a perovskite compound having two organic cations or may be a mixture of a perovskite compound having [$R^A$—$NH_2(H^+)$] and a perovskite compound having {[($R^B$)$_{n2}$-L-$NH_2$]($H^+$)}.

In the present invention, out of the two organic cations, the organic cation represented by [$R^A$—$NH_2(H^+)$] is preferably an organic ammonium cation ($R^A$—$NH_3$) made of an ammonium cationic organic group A which is formed by $R^A$ and $NH_2$ in Formula (IA) which are bonded together. In a case in which this organic ammonium cation has a resonant structure, the organic cation includes a cation having a resonant structure in addition to the organic ammonium cation. For example, in a case in which $X^a$ is NH ($R^{1c}$ represents a hydrogen atom) in a group represented by Formula (2), the organic cation includes an organic amidinium cation which is one of the resonant structures of the organic ammonium cation in addition to an organic ammonium cation of an ammonium cationic organic group formed of the group that can be represented by Formula (2) and $NH_2$ which are bonded to each other. Examples of the organic amidinium cation made of an amidinium cationic organic group include cations represented by Formula ($A^{am}$) below. In the present specification, the cations represented by Formula ($A^{am}$) will be expressed as "$R^{1b}C(=NH)$—$NH_3$" in some cases for convenience.

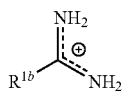

Formula ($A^{am}$)

The alkyl group as $R^A$ in Formula (IA) may be a unsubstituted alkyl group having no substituents or a substituted alkyl group having a substituent.

The unsubstituted alkyl group is also a linear alkyl group and is not particularly limited, but is preferably an alkyl group having 1 to 18 carbon atoms, more preferably an alkyl group having 1 to 6 carbon atoms, and still more preferably an alkyl group having 1 to 3 carbon atoms. Examples of the above-described alkyl group include methyl, ethyl, n-propyl, n-butyl, n-pentyl, n-hexyl, n-decyl, and the like.

The substituted alkyl group needs to be the above-described unsubstituted alkyl group having a substituent T described below and may be a linear alkyl group or a branched alkyl group. The unsubstituted alkyl group which is the substituted alkyl group before being substituted with the substituent T needs to be the above-described unsubstituted alkyl group and is preferably an alkyl group having 1 to 4 carbon atoms, more preferably an alkyl group having 1 to 3 carbon atoms, and still more preferably an alkyl group having 1 or 2 carbon atoms.

The cycloalkyl group is preferably a cycloalkyl group having 3 to 8 carbon atoms, and examples thereof include cyclopropyl, cyclopentyl, cyclohexyl, and the like.

The alkenyl group may be a linear alkenyl group or a branched alkenyl group and is preferably an alkenyl group having 2 to 18 carbon atoms and more preferably an alkenyl group having 2 to 6 carbon atoms. Examples thereof include ethenyl, allyl, butenyl, hexenyl, and the like. Examples of the branched alkenyl group include 1-methyl-2-propenyl.

The alkynyl group is preferably an alkynyl group having 2 to 18 carbon atoms and more preferably an alkynyl group having 2 to 4 carbon atoms, and examples thereof include ethynyl, butynyl, hexynyl, and the like.

The aryl group is preferably an aryl group having 6 to 14 carbon atoms and more preferably an aryl group having 6 to 12 carbon atoms, and examples thereof include phenyl.

Examples of the heteroaryl group include groups made of an aromatic hetero ring alone and groups made of a fused hetero ring obtained by fusing a ring other than the aromatic hetero ring, for example, an aromatic ring, an aliphatic ring, or a hetero ring with the aromatic hetero ring.

A ring-constituting hetero atom constituting the aromatic hetero ring is, for example, preferably a nitrogen atom, an oxygen atom, or a sulfur atom. In addition, the number of ring members of the aromatic hetero ring is preferably in a range of 3 to 8 and more preferably 5 or 6.

Examples of a five-membered aromatic hetero ring and a fused hetero ring including the five-membered aromatic hetero ring include individual ring groups of a pyrole ring, an imidazole ring, a pyrazole ring, an oxazole ring, a thiazole ring, a triazole ring, a furan ring, a thiophene ring, a benzimidazole ring, a benzoxazole ring, a benzothiazole ring, an indoline ring, and an indazole ring. In addition, examples of a six-membered aromatic hetero ring and a fused hetero ring including the six-membered aromatic hetero ring include individual ring groups of a pyridine ring, a pyrimidine ring, a pyrazine ring, a triazine ring, a quinoline ring, and a quinazoline ring.

In the group that can be represented by Formula (2), $X^a$ represents $NR^{1c}$, an oxygen atom, or a sulfur atom and is preferably $NR^{1c}$. Here, $R^{1c}$ represents a hydrogen atom or a substituent and is preferably a hydrogen atom, an alkyl group, a cycloalkyl group, an alkenyl group, an alkynyl group, an aryl group, or a heteroaryl group and more preferably a hydrogen atom.

$R^{1b}$ represents a hydrogen atom or a substituent and is preferably a hydrogen atom. Examples of a substituent that can be used as $R^{1b}$ include an alkyl group, a cycloalkyl group, an alkenyl group, an alkynyl group, an aryl group, a heteroaryl group, and an amino group.

An alkyl group, a cycloalkyl group, an alkenyl group, an alkynyl group, an aryl group, and a heteroaryl group that can be respectively used as $R^{1b}$ and $R^{1c}$ are identical to the respective groups of $R^A$, and preferred groups thereof are also identical thereto.

Examples of the group that can be represented by Formula (2) include a (thio)acyl group, a (thio)carbamoyl group, an imidoyl group, and an amidino group.

Examples of the (thio)acyl group include an acyl group and a thioacryl group. The acyl group is preferably an acyl group having 1 to 7 carbon atoms in total, and examples thereof include formyl, acetyl, propionyl, hexanoyl, and the like. The thioacyl group is preferably a thioacryl group having 1 to 7 carbon atoms in total, and examples thereof include thioformyl, thioacetyl, thiopropionyl, and the like.

Examples of the (thio)carbamoyl group include a carbamoyl group and a thiocarbamoyl group.

The imidoyl group is a group represented by $R^{1b}$—C($=NR^{1c}$)—, and $R^{1b}$ and $R^{1c}$ each are preferably a hydrogen atom or an alkyl group, and the alkyl group is more preferably identical to the alkyl group as $R^A$. Examples thereof include formimidoyl (HC($=NH$)—), acetoimidoyl ($CH_3C(=NH)$—), propionimidoyl ($CH_3CH_2C(=NH)$—), and the like. Among these, formimidoyl is preferred.

The amidino group as the group that can be represented by Formula (2) has a structure in which $R^{1b}$ in the imidoyl group is an amino group and $R^{1c}$ is a hydrogen atom.

Substituents that the respective groups as $R^A$ may have are not particularly limited as long as the substituents are groups other than an amino group and a substituted amino group. That is, $R^A$ which may have a substituent is different from "$(R^B)_{n2}$-L" of another cation described below. Here, example of the substituted amino group include mono- or di-alkylamino groups (including a nitrogen-containing aliphatic hetero ring), mono- or di-arylamino groups, acylamino groups, sulfoneamide groups, carbamoyl groups, sulfamoyl group, and the like.

Examples of the substituents that the respective groups as $R^A$ may have include the substituent T described below. The substituent T is not particularly limited, and examples thereof include an alkyl group, a cycloalkyl group, an alkenyl group, an alkynyl group, an aryl group, a heteroaryl group, an alkoxy group, an alkylthio group, an acyl group, an alkoxycarbonyl group, an alkylcarbonyloxy group, an aryloxycarbonyl group, an aryloxy group, an arylcarbonyloxy group, halogen atoms, a cyano group, a hydroxy group, a mercapto group, and a carboxy group. In a case in which $R^A$ is a methyl group, an imino (=NH) group cannot be included in the substituent T.

The substituent T is more preferably an alkyl group, a halogen atom, a cyano group, an aryl group, or a group formed of a combination thereof and particularly preferably a halogen atom.

As the substituent T, the alkyl group, the cycloalkyl group, the alkenyl group, the alkynyl group, and the aryl group are identical to the alkyl group, the cycloalkyl group, the alkenyl group, the alkynyl group, and the aryl group as $R^A$, and preferred groups thereof are also identical thereto. The heteroaryl group is identical to the heteroaryl group as $R^A$ and is preferably a heteroaryl group which does not including a nitrogen atom as a ring-constituting atom.

The alkoxy group and the alkylthio group each have an alkyl portion that is identical to the alkyl group as $R^A$ and are preferably an alkyl group.

The acyl group, the alkoxycarbonyl group, and the alkylcarbonyloxy group each preferably have an alkyl portion that is identical to the alkyl group as $R^A$.

The aryloxycarbonyl group, the aryloxy group, and the arylcarbonyloxy group each preferably have an aryl group or a heteroaryl group that is identical to the aryl group as $R^A$.

The halogen atom is preferably a fluorine atom, a chlorine atom, a bromine atom, or an iodine atom, more preferably a fluorine atom, a chlorine atom or a bromine atom, and particularly preferably a fluorine atom.

In the present invention, the respective substituents may be further substituted with a substituent. In this case, the substituent is not particularly limited as long as the substituent is a group obtained by combining at least two substituents of the respective substituents described above, and examples thereof include group obtained by combining an alkyl group and an alkynyl group, groups obtained by combining an alkyl group and a halogen atom (halogenated alkyl groups), cyanoalkyl groups, and the like.

When $R^A$ has multiple substituents T, the substituents T each may be identical to or different from each other. In addition, when the multiple substituents T are close to each other (particularly in close contact to each other), the substituents may be linked to each other and thus form a ring. In addition, rings, for example, an alicycle, an aromatic ring, and a hetero ring may form a fused ring obtained from the fusion of the above-described rings.

Among the respective groups described above, $R^A$ is preferably a substituted alkyl group, an unsubstituted alkyl group, an aryl group, a heteroaryl group, or a group that can be represented by Formula (2), more preferably a substituted alkyl group, an unsubstituted alkyl group, or a group that can be represented by Formula (2), still more preferably an alkyl group substituted with a halogen atom or a group that can be represented by Formula (2), and particularly preferably an alkyl group substituted with a fluorine atom since it is possible to reduce the fluctuation of the photoelectric conversion efficiency.

One cation among the above-described organic cations is formed of $R^A$ and $NH_2$ or $NH^3$.

In the following description, r-1 to r-23 below are illustrated as specific examples of $R^A$, but the present invention is not limited by r-1 to r-23. Meanwhile, in the specific examples below, * represents a bonding portion to a nitrogen atom, "Me" represents a methyl group, and "Et" represents an ethyl group.

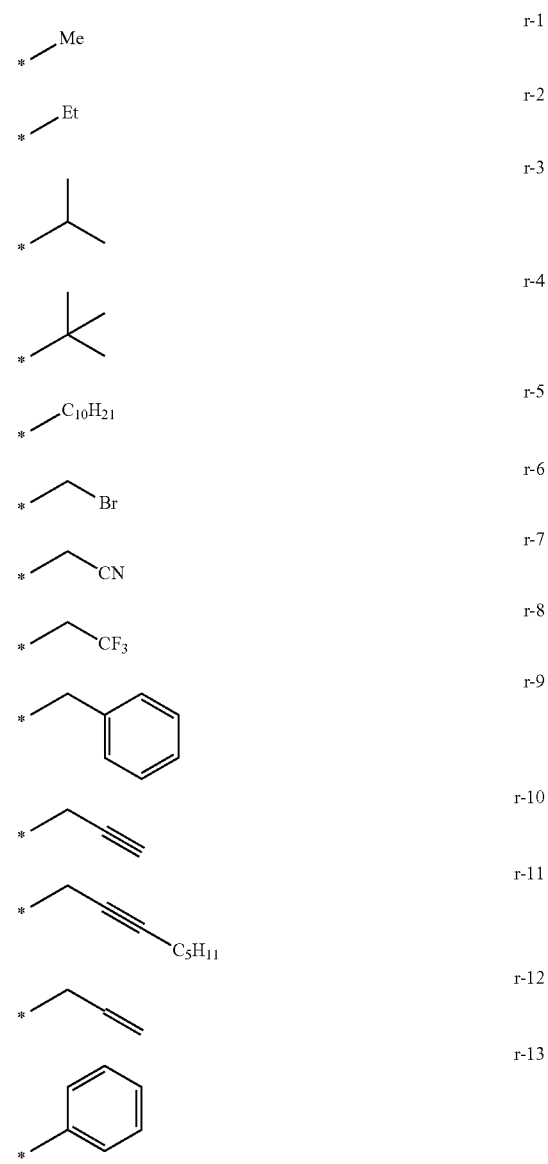

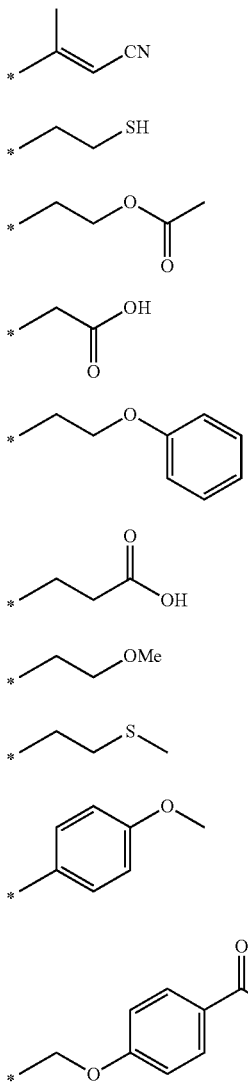

r-14
r-15
r-16
r-17
r-18
r-19
r-20
r-21
r-22
r-23

Another organic cation constituting perovskite-type crystal structure is $\{[(R^B)_{n2}\text{-L-NH}_2](H^+)\}$.

$R^B$ represents an amino group, a substituted amino group, or a cation thereof and specifically represents $NR^1R^2$ or $(NR^1R^2R^3)^+$. Here, $R^1$, $R^2$, and $R^3$ each independently represent a hydrogen atom or a substituent. All of $R^1$, $R^2$, and $R^3$ are preferably hydrogen atoms since $R^1$, $R^2$, and $R^3$ are capable of suppressing the variation in the moisture-heat resistance to a small extent by stabilizing the perovskite-type crystal structure. In a case in which $R^1$, $R^2$, and $R^3$ are substituents, the substituents are not particularly limited, examples thereof include the substituents T, preferred substituents are also identical thereto, and the substituents are particularly preferably an alkyl group.

When $R^B$ represents $(NR^1R^2R^3)^+$, the cation may have a counter anion $Y^{B-}$. The counter anion $Y^{B-}$ is not particularly limited, and examples thereof include a variety of anions. Examples of the anions include halide ions ($F^-$, $I^-$, $Br^-$, $Cl^-$, and the like), $OH^-$, $CF_3SO_3^-$, $CH_3COO^-$, $SH^-$, $SCN^-$, $ClO_4^-$, and the like. Among these, halide ions are preferred, and $I^-$ is more preferred. $Y^{B-}$ may be incorporated into an adjacent perovskite structure represented by Formula (I).

L represents a linking group and preferably has at least one group selected from the group consisting of groups represented by Formulae L-1 to L-9 below. Here, examples of the linking group L having at least one group selected from the group consisting of groups represented by Formulae L-1 to L-9 include a linking group L being a group represented by any one of Formulae L-1 to L-9 below and a linking group L being a group formed of a combination of at least two groups selected from the group consisting of the groups represented by Formulae L-1 to L-9 below.

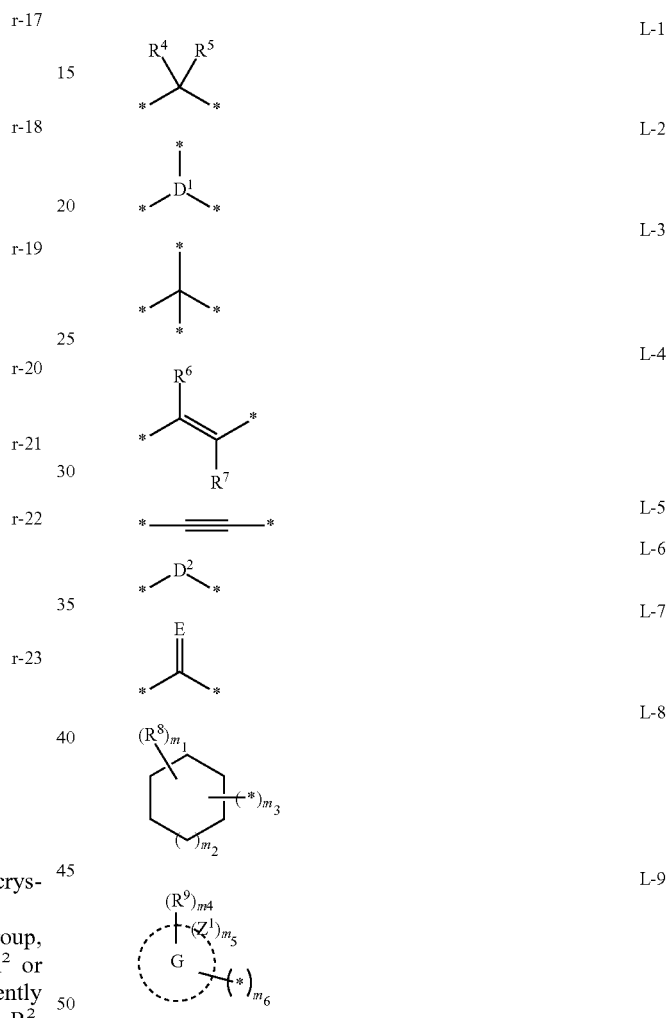

In the respective formulae, * represents a linking location to $NH_2$ or groups represented by the above-illustrated formulae.

In the groups represented by Formula L-1, $R^4$ and $R^5$ each independently are a hydrogen atom or a substituent and are all preferably a hydrogen atom. In a case in which $R^4$ and $R^5$ each are a substituent, examples of the substituent include the above-described substituents T, and an alkyl group and a halogen atom are preferred. The alkyl group is identical to the alkyl group as $R^A$, a preferred group is also identical thereto, and methyl is particularly preferred.

In the groups represented by Formula L-2, $D^1$ represents a nitrogen atom or $CR^{10}$. $R^{10}$ represents a hydrogen atom or a substituent and is preferably a hydrogen atom. Examples of the substituent include the above-described substituents T, and an alkyl group, an alkenyl group, an alkynyl group, an aryl group, a heteroaryl group, a halogen atom are preferred, and an alkyl group is more preferred. The alkyl group is identical to the alkyl group as $R^4$, an alkyl group having 1 to 30 carbon atoms is preferred, and an alkyl group having 1 to 10 carbon atoms is more preferred.

In the groups represented by Formula L-4, $R^6$ and $R^7$ each independently are a hydrogen atom or a substituent. In a case in which $R^6$ and $R^7$ each are a substituent, $R^6$ and $R^7$ may be identical substituents or different substituents. The substituents as $R^6$ and $R^7$ are preferably identical to the substituents T, and, among these, an alkyl group, a cyano group, and a halogen atom are preferred.

Meanwhile, Formula L-4 is represented as a trans body, but may be a cis body.

In the groups represented by Formula L-6, $D^2$ represents an oxygen atom, a sulfur atom, or $NR^{11}$. $R^{11}$ is identical to $R^{10}$, and a preferred group is also identical thereto.

In the groups represented by Formula L-7, E represents an oxygen atom, a sulfur atom, or $NR^{12}$. $R^{12}$ is identical to $R^{10}$, and a preferred group is also identical thereto.

In the groups represented by Formula L-8, $R^8$ represents a substituent, is identical to the substituent as $R^{10}$, and a preferred group is also identical thereto.

m1 represents an integer of 0 or more and is preferably an integer of 0 to 2 and more preferably 0.

m2 represents an integer of 0 or more and is preferably an integer of 0 to 3 and more preferably 0 (five-membered ring) or 1 (six-membered ring).

m3 represents an integer of 2 or more and is preferably an integer of 2 to 5 and more preferably 3 or 4.

In the groups represented by Formula L-9, the ring G represents an aryl ring made of a carbon atomic group necessary to constitute the ring or a heteroaryl ring made up of the above-described carbon atomic group and $Z^1$.

$Z^1$ represents a hetero atom or $NR^{13}$. Examples of the hetero atom include a nitrogen atom, an oxygen atom, and a sulfur atom, and a nitrogen atom or a sulfur atom is preferred. $R^{13}$ is identical to $R^{10}$, and a preferred group is also identical thereto.

$R^9$ represents a substituent, is identical to $R^8$, and a preferred group is also identical thereto.

m4 represents an integer of 0 or more and is preferably an integer of 0 to 3 and more preferably 0.

m5 represents an integer of 0 or more and is preferably an integer of 0 to 3 and more preferably 0 (aryl ring) or 1 (heteroaryl ring).

m6 represents an integer of 2 or more and is preferably an integer of 2 to 5 and more preferably 3 or 4.

The groups represented by Formula L-8 are preferably groups represented by Formula L-10 below, and the groups represented by Formula L-9 are preferably groups represented by Formula L-11 below.

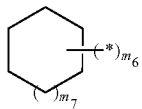

L-10

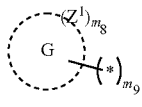

L-11

In Formulae L-10 and L-11, * represents a linking location to $R^B$, $NH_2$, or groups represented by the above-illustrated formulae.

In the groups represented by Formula L-10, m7 represents an integer of 0 or more and is identical to m2 in Formula L-8, and a preferred group is also identical thereto. m8 represents an integer of 3 or more and is preferably an integer of 3 to 5 and more preferably 3 or 4.

In the groups represented by Formula L-11, $Z^1$ is identical to $Z^1$ in Formula L-9, and a preferred group is also identical thereto. m5 represents an integer of 0 or more and is identical to m5 in Formula L-9, and a preferred group is also identical thereto. m9 represents an integer of 3 or more and is preferably an integer of 3 to 5 and more preferably 3 or 4.

The ring G represented by Formulae L-9 and L-11 is not particularly limited, and examples thereof include aryl rings such as a benzene ring and heteroaryl rings such as a pyrole ring, a thiophene ring, a furan ring, an imidazole ring, a pyrazole ring, an oxazole ring, a thiazole ring, an oxadiazole ring, a thiadiazole ring, an isooxazole ring, an isothiazole ring, a triazole ring, a pyridine ring, a pyrazine ring, a pyrimidine ring, a pyridazine ring, and a triazine ring, and, among these, a thiophene ring, a pyridine ring, or a triazine ring is preferred, and a thiophene ring is more preferred.

In the present invention, in a case in which the linking group L is a group formed of a combination of at least two groups selected from the group consisting of groups represented by Formulae L-1 to L-9, the kind of the groups being combined together is not particularly limited, and multiple groups of the same kind may be combined together, or different groups may be combined together. In this case, at least two groups selected from the group consisting of groups represented by Formulae L-1 to L-9 may be linked to each other and thus form a ring structure.

In addition, the number of the groups being combined is not particularly limited and is, for example, preferably in a range of 2 to 50 and more preferably in a range of 2 to 10.

At this time, the length of a chain of the linking group formed of a combination thereof is preferably in a range of 0 to 10 and more preferably in a range of 0 to 5. Here, the length of a chain of the linking group refers to the minimum number of atoms constituting a chain between atoms that are bonded to the two amino groups. In a case in which three or more amino groups are present (in a case in which the number of the linking locations * is three or more), the lengths of individual chains of two combinations of the amino groups are obtained, and the longer length is considered as the length of a chain of the linking group. For example, the minimum numbers of atoms between two amino groups in Compound L-2-2 below are all five, and the lengths of a chain of the linking group are five. In addition, the minimum numbers of atoms between two amino groups in Compound L-8-4 are all three, and the lengths of a chain of the linking group are three. On the other hand, the minimum numbers of atoms between two amino groups in Compound L-9-4 are two, three, and four, and the lengths of a chain of the linking group reach four.

The group formed of a combination of at least two groups selected from the group consisting of groups represented by Formulae L-1 to L-9 is preferably a group represented by any one of Formulae Lp-1 to Lp-9 below.

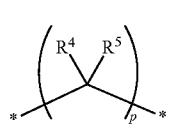

Lp-1

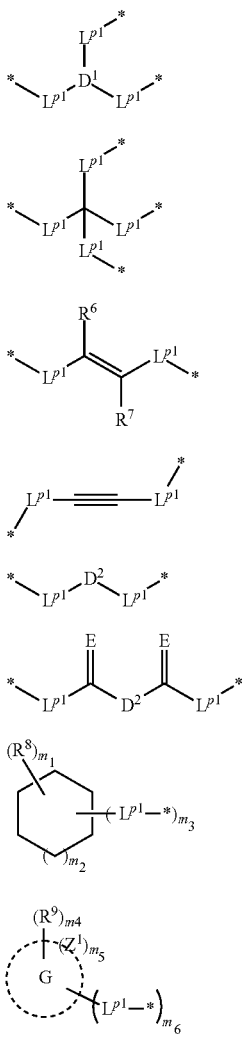

In the group represented by Formula Lp-1, $R^4$ and $R^5$ each are identical to $R^4$ and $R^5$ in the group represented by Formula L-1, and a preferred group is also identical thereto. p represents an integer of 2 or more, preferably represents an integer of 2 to 5, and more preferably 2.

In each group represented by any one of Formulae Lp-2 to Lp-9, $LP^1$ represents a single bond or the group represented by Formula Lp-1, at least one of multiple $LP^1$ is the group represented by Formula Lp-1, and the multiple $LP^1$ are identical to or different from each other.

In the group represented by Formula Lp-2, $D^1$ is identical to $D^1$ in the group represented by Formula L-2, and a preferred group is also identical thereto. In the group represented by Formula Lp-4, $R^6$ and $R^7$ each are identical to $R^6$ and $R^7$ in the group represented by Formula L-4, and a preferred group is also identical thereto. In the group represented by Formula Lp-6, $D^2$ is identical to $D^2$ in the group represented by Formula L-6, and a preferred group is also identical thereto. In the group represented by Formula Lp-7, E is identical to E in the group represented by Formula L-7, a preferred group is also identical thereto, and two E's may be identical to or different from each other. In addition, $D^2$ is identical to $D^2$ in the group represented by Formula L-6, and a preferred group is also identical thereto. In the group represented by Formula Lp-8, $R^8$, m1, m2, and m3 each are identical to $R^8$, m1, m2, and m3 in the group represented by Formula L-8, and a preferred group is also identical thereto. In the group represented by Formula Lp-9, a ring G, $R^9$, $Z^1$, m4, m5, and m6 each are identical to the ring G, $R^9$, $Z^1$, m4, m5, and m6 in the group represented by Formula L-9, and a preferred group is also identical thereto.

The group formed of the above-described combination is more preferably one of groups formed of the following combination.

Examples of the groups include a group represented by Formula Lp-1 which is formed of a combination of multiple, preferably 2 to 5, and more preferably two groups represented by Formula L-1 (examples of an amine compound which has this group and is represented by $[(R^B)_{n2}\text{-L-NH}_2]$ include Compounds L-1-1 to L-1-4 below), a group formed of a combination of one or more groups represented by Formula L-2 and one or more groups represented by Formula L-1 (preferably a group represented by Formula Lp-2 which is made up of one group represented by Formula L-2 and three groups represented by Formula Lp-1, examples of an amine compound having this group include Compounds L-2-1 and L-2-2 below), a group formed of a combination of one or more groups represented by Formula L-3 and one or more groups represented by Formula L-1 (preferably a group represented by Formula Lp-3 which is made up of one group represented by Formula L-3 and four groups represented by Formula Lp-1, examples of an amine compound having this group include Compound L-3-1 below), a group formed of a combination of one or more groups represented by Formula L-5 and one or more groups represented by Formula L-1 (preferably a group represented by Formula Lp-5 which is made up of one group represented by Formula L-5 and two groups represented by Formula Lp-1, examples of an amine compound having this group include Compound L-5-1 below), a group formed of a combination of one or more groups represented by Formula L-6 and one or more groups represented by Formula L-1 (preferably a group represented by Formula Lp-6 which is made up of one group represented by Formula L-6 and two groups represented by Formula Lp-1, examples of an amine compound having this group include Compounds L-6-1 to L-6-3 below), a group formed of a combination of one or more groups represented by Formula L-6 and one or more groups represented by Formula L-7 (preferably a group represented by Formula Lp-7 which is made up of one group represented by Formula L-6 and two groups represented by Formula L-7, examples of an amine compound having this group include Compound L-7-3 below), a group formed of a combination of one or more groups represented by Formula L-9 and one or more groups represented by Formula L-1 (preferably a group represented by Formula Lp-9 which is made up of one group represented by Formula L-9 and two groups represented by Formula L-1, examples of an amine compound having this group include Compound L-9-2 below), and the like.

The linking group L preferably has at least one group selected from the group consisting of at least the respective groups represented by Formulae L-1, L-2, L-3, L-8, and L-9 since the variation in the moisture-heat resistance can be suppressed to a small extent. The linking group L more preferably has at least one group selected from the group consisting of the respective groups represented by Formulae L-1, L-2, L-3, L-10, and L-11. The linking group L still more preferably has at least one group selected from the group consisting of the respective groups represented by Formulae L-2, L-3, L-10, and L-11. The linking group L is particularly preferably the group represented by Formula Lp-1, the group represented by Formula Lp-2, the group represented by Formula Lp-3, the group represented by Formula L-10, or the group represented by Formula Lp-11.

In addition, the linking group L is preferably a symmetric structure. The symmetric structure may be any one of a linearly symmetric structure, a point-symmetric structure, a rotationally symmetric structure, and the like. In this case, in the respective groups represented by Formulae Lp-2 to Lp-9, the multiple $LP^1$ are preferably identical to or different from each other.

In Formula (IA), n2 represents an integer of 1 or more and is preferably an integer of 1 to 5 and more preferably 2 or 3. When n2 is in the above-described range, the stability of perovskite-type crystal structure improves, and it is possible to suppress the variation in the moisture-heat resistance to a small extent.

Hereinafter, specific examples of the amine compound represented by $[(R^B)_{n2}\text{-L-NH}_2]$ in Formula (IA) will be described, but the present invention is not limited by the specific examples.

Meanwhile, in the following specific examples, "nL" in Compound No. "L-nL-mL" indicates a number corresponding to Formulae L-1 to L-9 or Formulae Lp-1 to Lp-9, and "mL" indicates the serial number of exemplified compounds in the respective formulae.

The linking group L in the following compounds is a residue obtained by removing all amine groups (removing amine groups corresponding to $D^1$, $D^2$, and E) from the following compounds.

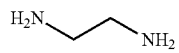
L-1-1

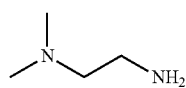
L-1-2

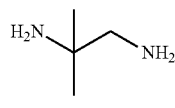
L-1-3

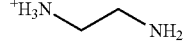
L-1-4

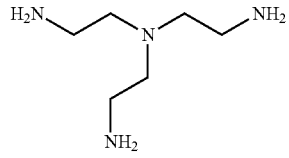
L-2-1

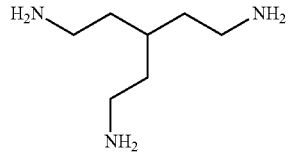
L-2-2

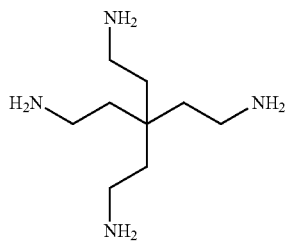
L-3-1

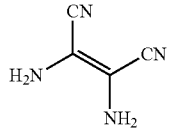
L-4-1

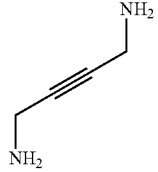
L-5-1

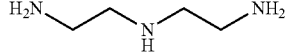
L-6-1

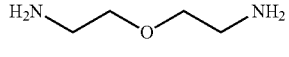
L-6-2

L-6-3

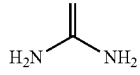
L-7-1

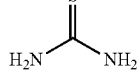
L-7-2

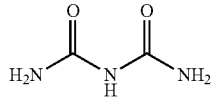
L-7-3

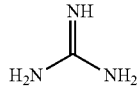
S-1

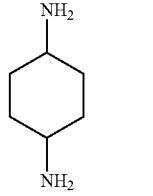
L-8-1

L-8-2

L-8-3 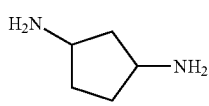

L-8-4 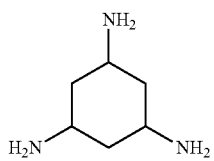

L-9-1 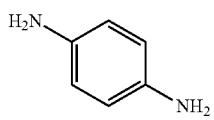

L-9-2 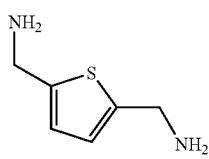

L-9-3 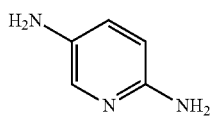

L-9-4 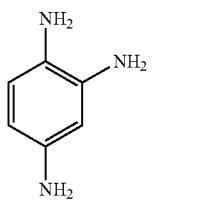

L-9-5 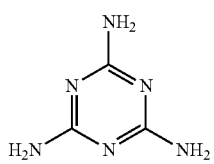

In Formula (IA), n represents a numerical value satisfying 0<n<1.00 and is preferably a numerical value satisfying 0.05≤n≤0.90, more preferably a numerical value satisfying 0.10≤n≤0.50, and still more preferably a numerical value satisfying 0.15≤n≤0.30. When n is in the above-described range, the variation in the moisture-heat resistance can be suppressed to a small extent, and solar cell are enabled to exhibit stable cell performance.

In the perovskite-type light absorber used to form the photosensitive layer 13, n is determined by the compositional ratio (molar ratio) between raw materials to be synthesized for the perovskite-type light absorber.

The perovskite compound that is used in the present invention has cations of metallic atoms (metallic cations) in the crystal structure. These metallic cations are not particularly limited as long as the metallic cations are cations of metallic atoms capable of having the perovskite-type crystal structure. Examples of the above-described metallic atoms include metallic atoms of calcium (Ca), strontium (Sr), cadmium (Cd), copper (Cu), nickel (Ni), manganese (Mn), iron (Fe), cobalt (Co), palladium (Pd), germanium (Ge), tin (Sn), lead (Pb), ytterbium (Yb), europium (Eu), indium (In), and the like. Among these, the metallic cation is particularly preferably a cation of a Pb atom or a Sn atom. The kinds of the metallic cation may be one or more. In a case in which two or more kinds of metallic cations are present, two kinds of cations of a Pb atom and a Sn atom are preferred. The ratio between the metallic cations is not particularly limited.

The perovskite compound that is used in the present invention has anions in the crystal structure. Preferred examples of the anions include individual anions of anionic atoms such as halogen atoms and anionic atomic groups such as $NCS^-$, $NCO^-$, $CH_3COO^-$, and $HCOO^-$. Among these, anions of halogen atoms are more preferred. Examples of the halogen atoms include a fluorine atom, a chlorine atom, a bromine atom, an iodine atom, and the like.

The anion may be an anion of one kind of atom or atomic group or an anion of two or more kinds of atoms or atomic groups. In a case in which only one kind of anion is present, an anion of an iodine atom is preferred. In a case in which two or more kinds of anions are present, anions represented by Formula (x) below are preferred.

$$X^{A1}_{(3-m)}X^{A2}_m \qquad \text{Formula (x)}$$

In Formula (x), $X^{A1}$ and $X^{A2}$ each independently represent mutually different anions and are preferably anions of mutually different halogen atoms and more preferably a pair of anions in which one anion is an anion of an iodine atom and the other anion is an anion of a chlorine atom or an anion of a bromine atom.

In Formula (x), m is preferably 0.01 to 2.99, more preferably 0.1 to 1.4, and still more preferably 0.5 to 1.0.

The perovskite compound having the respective constituent ions described above needs to be a compound capable of having the perovskite-type crystal structure including the respective constituent ions described above and is preferably a perovskite compound represented by Formula (I) below.

$$A_aM_mX_x \qquad \text{Formula (I)}$$

In the formula, A represents a cationic organic group. M represents a metallic atom. X represents an anionic atom or atomic group.

a represents 1 or 2, m represents 1, and a, m, and x satisfy a+2m=x.

The cationic organic group represented by A forms an organic cation represented by Formula (IA) in the perovskite-type crystal structure. Therefore, the cationic organic group is identical to $R^A—NH_2$ and $[(R^B)_{n2}\text{-L-NH}_2]$ in Formula (IA), which has been described in the organic cation section, and a preferred group is also identical thereto. Here, $R^A$, $R^B$, n2, and L are as described above. The metallic atom represented by M is a metallic atom forming the metallic cation in the perovskite-type crystal structure. This metallic atom is identical to the metallic atom described in the metallic cation section, and a preferred atom is also identical thereto. The anionic atom or atomic group represented by X is an anionic atom or atomic group forming the anion in the perovskite-type crystal structure. This anionic atom or atomic group is identical to the anionic atom or atomic group described in the anion section, and a preferred atom or atomic group is also identical thereto.

The perovskite compound represented by Formula (I) is a perovskite compound represented by Formula (I-1) below in a case in which a is 1 and a perovskite compound represented by Formula (I-2) below in a case in which a is 2.

$$AMX_3 \qquad \text{Formula (I-1)}$$

$$A_2MX_4 \qquad \text{Formula (I-2)}$$

In Formulae (I-1) and (I-2), A represents a cationic organic group and is identical to A in Formula (I), and a preferred group is also identical thereto. M represents a metallic atom and is identical to M in Formula (I), and a preferred atom is also identical thereto. X represents an anionic atom or atomic group and is identical to X in Formula (I), and a preferred atom or atomic group is also identical thereto.

The perovskite compound that is used in the present invention may be any one of the compound represented by Formula (I-1) and the compound represented by Formula (I-2) or may be a mixture thereof. Therefore, in the present invention, at least one kind of the perovskite compound needs to be present as the light absorber, and it is not necessary to clearly differentiate which compound is used using the compositional formula, the molecular formula, the crystal structure, and the like.

A method for manufacturing the perovskite-type light absorber that is used in the present invention is not particularly limited, and the perovskite-type light absorber can be synthesized using $R^A$—$NH_2$ and $(R^B)_{n2}$-L-$NH_2$ according to a well-known method. Examples of the well-known method include methods described in KR10-1172374B, WO2013/126385A, and Angew. Chem. Int. Ed. 2014, 53, pp. 3151 to 3157. Examples thereof further include methods described in Akihiro Kojima, Kenjiro Teshima, Yasuo Shirai, and Tsutomu Miyasaka, "Organometal Halide Perovskites as Visible-Light Sensitizers for Photovoltaic Cells", J. Am. Chem. Soc., 2009, 131 (17), pp. 6050 and 6051.

Although not particularly limited, the method for manufacturing the perovskite-type light absorber will be specifically described below. For example, the perovskite-type light absorber represented by Formula (I) can be synthesized using $MX_2$ and $R^A$—$NH_3X$ or $(R^B)_{n2}$-L-$NH_3X$ and $MX_2$ according to the method described in J. Am. Chem. Soc., 2009, 131 (17), pp. 6050 and 6051. Here, X represents an atom or an atomic group which becomes an anion and is identical to X in Formula (I). $R^A$ is identical to $R^A$ in Formula (IA), and $R^B$, L, and n2 each are identical to $R^B$, L, and n2 in Formula (IA). Meanwhile, in this synthesis method, the molar ratio between $MX_2$ and $R^A$—$NH_3X$ or $(R^B)_{n2}$-L-$NH_3X$ is adjusted depending on n in Formula (IA).

<Hole Transportation Layer 3>

In a preferred aspect of the photoelectric conversion element of the present invention, as in the photoelectric conversion elements 10A to 10D, the hole transportation layer 3 is provided between the first electrode 1 and the second electrode 2. The hole transportation layer 3 is preferably provided between the photosensitive layer 13 in the first electrode 1 and the second electrode 2.

The hole transportation layer 3 has a function of supplementing electrons to the oxidant of the light absorber and is preferably a solid-form layer (a solid hole transportation layer).

A hole-transporting material used to form the hole transportation layer 3 may be a liquid material or a solid material and is not particularly limited. Examples thereof include inorganic materials such as CuI and CuNCS, organic hole-transporting materials described in, for example, Paragraphs 0209 to 0212 of JP2001-291534A, and the like. Preferred examples of the organic hole-transporting material include conductive polymers such as polythiophene, polyaniline, polypyrrole, and polysilane, spiro compounds in which two rings share a central atom having a tetrahedral structure such as C or Si, aromatic amine compounds such as triarylamine, triphenylene compounds, nitrogen-containing heterocyclic compounds, and liquid crystalline cyano compounds.

The hole-transporting material is preferably an organic hole-transporting material which can be applied in a solution form and turns into solid, and specific examples thereof include 2,2'7,7'-tetrakis-(N,N-di-p-methoxyphenylamine)-9,9-spirobifluorene (also referred to as spiro-OMeTAD), poly (3-hexylthiophene-2,5-diyl), 4-(diethylamino)benzoaldehyde diphenylhydrazone, polyethylene dioxythiophene (PEDOT), and the like.

The film thickness of the hole transportation layer 3 is not particularly limited, but is preferably 50 µm or less, more preferably in a range of 1 nm to 10 µm, still more preferably in a range of 5 nm to 5 µm, and particularly preferably in a range of 10 nm to 1 µm. Meanwhile, the film thickness of the hole transportation layer 3 corresponds to the average distance the second electrode 2 and the surface of the photosensitive layer 13 and can be measured by observing the cross section of the photoelectric conversion element using a scanning electron microscope (SEM) or the like.

<Electron Transportation Layer 4>

In a preferred aspect of the photoelectric conversion element of the present invention, as in the photoelectric conversion element 10E, the electron transportation layer 4 is provided between the first electrode 1 and the second electrode 2. In this aspect, the electron transportation layer 4 is preferably in contact with (laminated on) the photosensitive layer 13C.

The electron transportation layer 4 is identical to the electron transportation layer 15 except for the fact that the electron transportation destination is the second electrode 2 and the electron transportation layer is formed at a different location.

<Second Electrode 2>

The second electrode 2 functions as a positive electrode in solar cells. The second electrode 2 is not particularly limited as long as the second electrode is conductive and, generally, can be provided with the same constitution as that of the conductive support 11. In a case in which a sufficient strength is ensured, the support 11a is not essentially required.

The structure of the second electrode 2 is preferably a structure having a strong power-collection effect. In order to allow light to reach the photosensitive layer 13, at least one of the conductive support 11 and the second electrode 2 needs to be substantially transparent. In the solar cell of the present invention, it is preferable that the conductive support 11 is transparent and sunlight enters the solar cell through the support 11a side. In this case, the second electrode 2 more preferably has a property of reflecting light.

Examples a material used to form the second electrode 2 include metal such as platinum (Pt), gold (Au), nickel (Ni), copper (Cu), silver (Ag), indium (In), ruthenium (Ru), palladium (Pd), rhodium (Rh), iridium (Jr), osmium (Os), and aluminum (Al), the above-described conductive metallic oxides, carbon materials, conductive polymers, and the like. The carbon materials needs to be conductive materials formed of carbon atoms bonded together, and examples thereof include fullerene, carbon nanotubes, graphite, graphene, and the like.

The second electrode 2 is preferably a thin film (including a thin film obtained by means of vapor deposition) of metal or a conductive metallic oxide or a glass or plastic substrate having this thin film. The glass or plastic substrate is preferably a glass substrate having a gold or platinum thin film or a glass substrate on which platinum is vapor-deposited.

The film thickness of the second electrode 2 is not particularly limited, but is preferably in a range of 0.01 to 100 µm, more preferably in a range of 0.01 to 10 µm, and particularly preferably in a range of 0.01 to 1 µm.

<Other Constitutions>

In the present invention, in order to prevent the first electrode 1 and the second electrode 2 from coming into contact with each other, a spacer or a separator can also be used instead of the blocking layer 14 or together with the blocking layer 14.

In addition, a hole-blocking layer may be provided between the second electrode 2 and the hole transportation layer 3.

<<Solar Cell>>

The solar cell of the present invention is constituted using the photoelectric conversion element of the present invention. For example, as illustrated in FIGS. 1 to 6, it is possible to use the photoelectric conversion element 10 constituted so as to cause the external circuit 6 to work as a solar cell. As the external circuit 6 which comes into contact with the first electrode 1 (the conductive support 11) and the second electrode 2, a well-known circuit can be used without any particularly limitation.

The present invention can be applied to, for example, individual solar cells described in KR10-1172374B, WO2013/126385A, Angew. Chem. Int. Ed. 2014, 53, pp. 3151 to 3157, J. Am. Chem. Soc., 2009, 131 (17), pp. 6050 and 6051, and Science, 338, p. 643 (2012).

In order to prevent the deterioration, evaporation, and the like of constituent substances, the solar cell of the present invention preferably has a side surface that is sealed with a polymer, an adhesive, or the like.

As described above, the photoelectric conversion element and the solar cell of the present invention include the photosensitive layer 13 formed of the perovskite compound represented by Formula (I), allow only a small degree of cell performance degradation in a high-temperature and humidity environment among solar cells, and exhibit stable cell performance.

<<Method for Manufacturing Photoelectric Conversion Element and Solar Cell>>

The photoelectric conversion element and the solar cell of the present invention can be manufactured using a well-known manufacturing method, for example, individual methods described in KR10-1172374B, WO2013/126385A, Angew. Chem. Int. Ed. 2014, 53, pp. 3151 to 3157, J. Am. Chem. Soc., 2009, 131 (17), pp. 6050 and 6051, and Science, 338, p. 643 (2012).

Hereinafter, the method for manufacturing the photoelectric conversion element and the solar cell of the present invention will be simply described.

The method for manufacturing the photoelectric conversion element and the solar cell of the present invention (hereinafter, referred to as the manufacturing method of the present invention) includes a step of brining a layer on which the photosensitive layer is formed into contact with liquid containing the perovskite-type light absorber represented by Formula (I). The manufacturing method of the present invention may include other steps without any particular limitation as long as the manufacturing method include the above-described step.

In the manufacturing method of the present invention, first, at least one of the blocking layer 14, the porous layer 12, the electron transportation layer 15, and the hole transportation layer 16 are formed on the conductive support 11 as desired.

The blocking layer 14 can be formed by, for example, applying a dispersoid including the above-described insulating substance, a precursor compound thereof, or the like onto the surface of the conductive support 11 and firing the dispersoid or thermally decomposing the dispersoid by means of spraying.

A material used to form the porous layer 12 is preferably used in a fine particle form and more preferably used in a form of fine particles in a dispersoid.

A method for forming the porous layer 12 is not particularly limited, and examples thereof include wet-type methods, dry-type methods, and other methods (for example, methods described in Chemical Review, Vol. 110, p. 6595 (published on 2010)). In these methods, it is preferable to apply the dispersoid (paste) onto the surface of the conductive support 11 or the surface of the blocking layer 14 and then fire the dispersoid at a temperature in a range of 100° C. to 800° C. for ten minutes to ten hours, for example, in the air. In such a case, it is possible to bring the fine particles into close contact with each other.

In a case in which firing is performed multiple times, the temperature of firing that is not the final firing (the non-final firing temperature) is preferably set to be lower than the temperature of the final firing (the final firing temperature). For example, in a case in which titanium oxide paste is used, the non-final firing temperature can be set in a range of 50° C. to 300° C. In addition, the final firing temperature can be set to be higher than the non-firing firing temperature in a range of 100° C. to 600° C. In a case in which a glass support is used as the support 11a, the firing temperature is preferably in a range of 60° C. to 500° C.

The amount of a porous material applied to form the porous layer 12 is appropriately set depending on the film thickness of the porous layer 12, the number of times of coating, and the like and is not particularly limited. The amount of the porous material applied to square meter of the surface area of the conductive support 11 is, for example, preferably in a range of 0.5 to 500 g and more preferably in a range of 5 to 100 g.

In a case in which the electron transportation layer 15 or the hole transportation layer 16 is provided, the layer can be formed in the same manner as the hole transportation layer 3 or the electron transportation layer 4 described below.

Next, the photosensitive layer 13 is provided.

A method for providing the photosensitive layer 13 is not particularly limited, and examples thereof include wet-type methods and dry-type methods. In the present invention, wet-type methods are preferred, and, for example, a method in which the surface is brought into contact with liquid including the perovskite-type light absorber (the following forming liquid) is preferred. In this method, first, a forming liquid for forming the photosensitive layer is prepared. This forming liquid can be prepared by mixing $R^A$—$NH_3X$ (in the formula, $R^A$ and X are as described above), $(R^B)_{n2}$-L-$NH_3X$ (in the formula, $R^B$, L, n2, and X are as described above), and $MX_2$ (in the formula, M and X are as described above) at a predetermined molar ratio and then heating the components. This forming liquid is generally a solution (also referred to as a light absorber solution), but may be a suspension. The molar ratio between the respective components in the forming liquid is set depending on n in Formula (IA) described above and the like. Heating conditions are not particularly limited, but the heating temperature is preferably in a range of 30° C. to 200° C. and more preferably in a range of 70° C. to 150° C. The heating duration is preferably in a range of 0.5 to 100 hours and more preferably in a range of 1 to 3 hours. As a solvent or a dispersion medium, substances described below can be used.

Next, the prepared light absorber solution is brought into contact with the surface of a layer the surface of which the photosensitive layer 13 is formed (in the photoelectric conversion element 10, any layer of the porous layer 12, the blocking layer 14, the electron transportation layer 15, and the hole transportation layer 16). Specifically, it is preferable to apply the forming liquid onto the surface or immerse the surface in the forming liquid. The temperature at which the forming liquid is brought into contact with the surface is preferably in a range of 5° C. to 100° C., and the immersion duration is preferably in a range of 5 seconds to 24 hours and more preferably in a range of 20 seconds to 1 hour. In a case in which the applied forming liquid is dried, the forming liquid is preferably dried using heat and is generally dried by being generally heated at 20° C. to 300° C. and being preferably heat at 50° C. to 170° C.

In addition, it is possible to use a method in which an $R^A$ solution including the $R^A$—$NH_3X$, an $R^B$ solution including the $(R^B)_{n2}$-L-$NH_3X$, and an $MX_2$ solution including the $MX_2$ are separately applied (including the immersion method) and are dried as necessary. In this method, any solution may be applied in advance, but the $MX_2$ solution is preferably applied in advance. In this method, the molar ratio between $R^A$—$NH_3X$, $(R^B)_{n2}$-L-$NH_3X$, and $MX_2$, coating conditions, and drying conditions are identical to those in the above-described method. In this method, instead of applying the $R^A$ solution, the $R^B$ solution, and the $MX_2$ solution, it is also possible to vapor-deposit $R^A$—$NH_3X$, $(R^B)_{n2}$-L-$NH_3X$, or $MX_2$.

In addition, as another method, it is possible to use a dry-type method such as vapor deposition in a vacuum in which a compound or a mixture obtained by removing the solvent from the forming liquid. For example, it is possible to use a method in which the $R^A$—$NH_3X$, the $(R^B)_{n2}$-L-$NH_3X$, and the $MX_2$ are simultaneously or sequentially vapor-deposited.

In the above-described method and the like, the perovskite compound represented by Formula (I) is formed on the surface of the porous layer 12, the blocking layer 14, the electron transportation layer 15, or the hole transportation layer 16 as the photosensitive layer.

On the photosensitive layer 13 formed as described above, preferably, the hole transportation layer 3 or the electron transportation layer 4 is formed.

The hole transportation layer 3 can be formed by applying and drying a hole-transporting material solution including a hole-transporting material to the photosensitive layer 13. In the hole-transporting material solution, the concentration of the hole-transporting material is preferably in a range of 0.1 to 1.0 M (mol/L) since coatability is excellent and, in a case in which the porous layer 12 is provided, the hole-transporting material is capable of easily intruding into the inside of pores in the porous layer 12.

The electron transportation layer 4 can be formed by applying and drying an electron-transporting material solution including an electron-transporting material to the photosensitive layer 13.

After the hole transportation layer 3 and the like are formed, the second electrode 2 is formed, thereby manufacturing the photoelectric conversion element.

The film thicknesses of the respective layers can be adjusted by appropriately changing the concentrations of the respective dispersion liquids or solutions and the number of times of coating. For example, in a case in which the photosensitive layers 13B and 13C having a thick film thickness are provided, the forming liquid may be applied and dried multiple times.

The respective dispersion liquids and solutions described above may respectively include additives such as a dispersion aid and a surfactant.

Examples of the solvent or dispersion medium that is used in the method for manufacturing the solar cell include solvents described in JP2001-291534A, but the solvent or dispersion medium is not limited thereto. In the present invention, organic solvents are preferred, and alcohol solvents, amide solvents, nitrile solvents, hydrocarbon solvents, lactone solvents, halogen solvents, and solvent mixtures of two or more thereof are more preferred. The solvent mixture is preferably a solvent mixture of an alcohol solvent and a solvent selected from amide solvents, nitrile solvents, and hydrocarbon solvents. Specifically, methanol, ethanol, isopropanol, γ-butyrolactone, chlorobenzene, acetonitrile, N,N'-dimethylformamide (DMF), dimethylacetoamide, or a solvent mixture thereof is preferred.

A method for applying the solutions or dispersion liquids used to form the respective layers is not particularly limited, and it is possible to use a well-known coating method such as spin coating, extrusion die coating, blade coating, bar coating, screen printing, stencil printing, roll coating, curtain coating, spray coating, dip coating, an inkjet printing method, or an immersion method. Among these, spin coating, screen printing, and the like are preferred.

The photoelectric conversion element of the present invention may be subjected to an efficiency stabilization treatment such as annealing, light soaking, or being left in an oxygen atmosphere as necessary.

The photoelectric conversion element produced as described above can be used as a solar cell by connecting the external circuit 6 to the first electrode 1 and the second electrode 2.

EXAMPLES

Hereinafter, the present invention will be described in more detail on the basis of examples, but the present invention is not limited to the following examples.

Example 1

(Manufacturing of Photoelectric Conversion Element and Solar Cell (Specimen No. 101))

The photoelectric conversion element 10A and the solar cell illustrated in FIG. 1 were manufactured in an order described below. In a case in which the film thickness of the photosensitive layer 13 is thick, the photoelectric conversion element and the solar cell correspond to the photoelectric conversion element 10B and the solar cell illustrated in FIG. 2.

An isopropanol solution containing 15% by mass of titanium diisopropoxide bis(acetylacetonate) (manufactured by Sigma-Aldrich Japan K.K.) was diluted with 1-ethanol, thereby preparing 0.02 M of a solution for a blocking layer.

A conductive support 11 obtained by forming a fluorine-doped $SnO_2$ conductive film (a transparent electrode 11b, a film thickness of 300 nm) on a glass support 11a (having a thickness of 2 mm) was prepared.

A blocking layer 14 (having a film thickness of 50 nm) was formed on the $SnO_2$ conductive film using the 0.02 M of a solution for the blocking layer at 450° C. by means of a spray thermal decomposition method.

Ethyl cellulose, lauric acid, and terpineol were added to an ethanol dispersion liquid of titanium oxide ($TiO_2$, acetase, an average particle diameter of 20 nm), thereby preparing titanium oxide paste.

The prepared titanium oxide paste was applied onto the blocking layer 14 by means of a screen printing method and was fired at 500° C. in the air for three hours. After that, the obtained titanium oxide fired body was immersed in an aqueous solution of 40 mM of $TiCl_4$, was heated at 60° C. for one hour, and, continuously, was heated at 500° C. for 30 minutes, thereby forming the porous layer 12 (having a film thickness of 300 nm) made of $TiO_2$.

A 40% methanol solution of methyl amine (27.86 mL) and 57% by mass of hydroiodic acid (30 mL) were stirred in a flask at 0° C. for two hours and then were condensed, thereby obtaining a $CH_3NH_3I$ coarse body. The obtained $CH_3NH_3I$ coarse body was dissolved in ethanol and was recrystallized with diethyl ether, and the obtained crystals were filtered and were dried at 50° C. for five hours under reduced pressure, thereby obtaining purified $CH_3NH_3I$.

$N(CH_3)_2CH_2CH_2NH_2$ (Compound L-1-2) and 57% by mass of hydroiodic acid were fed into ethanol in the flask at a molar ratio of 1:1, were stirred at 0° C. for two hours, then, were heated to 50° C., and were stirred for one hour. After that, the components were condensed, thereby obtaining a $N(CH_3)_2CH_2CH_2NH_3I$ coarse body. The obtained coarse body was recrystallized with acetonitrile, and the obtained crystals were filtered and were dried at 50° C. for five hours under reduced pressure, thereby obtaining purified $N(CH_3)_2CH_2CH_2NH_3I$.

Next, the purified $CH_3NH_3I$, the purified $N(CH_3)_2CH_2CH_2NH_3I$, and $PbI_2$ were stirred and mixed together at 60° C. in DMF for 12 hours at a molar ratio of 0.95:0.05:1.0 (n=0.05) and then were filtered using a polytetrafluoroethylene (PTFE) syringe filter, thereby preparing 40% by mass of a light absorber solution.

The prepared light absorber solution was applied onto the porous layer 12 formed on the conductive support 11 using a spin coating method (at 2,000 rpm for 60 seconds) and then was dried at 100° C. for one hour using a hot plate, and a photosensitive layer 13 (having a film thickness of 310 nm (including the film thickness of a porous layer 12 which was 300 nm)) was provided, thereby producing a first electrode 1. A photosensitive layer 13A included the perovskite compound which had the organic cation represented by Formula (IA) and was represented by Formula (I). In Table 1, the organic cation of Formula (IA), n, and M and X in Formula (I) are shown (this shall apply to the following examples.)

As a hole-transporting material, spiro-OMeTAD (180 mg) was dissolved in chlorobenzene (1 mL). An acetonitrile solution (37.5 μL) obtained by dissolving lithium-bis(trifluoromethansulfonyl)imide (170 mg) in acetonitrile (1 mL) and t-butylpyridine (TBP, 17.5 μL) were added to and mixed with the chlorobenzene solution, thereby preparing a solution for the hole transportation layer.

Next, the prepared solution for the hole transportation layer was applied using a spin coating method and dried on the photosensitive layer 13 in the first electrode 1, thereby forming a hole transportation layer 3A (having a film thickness of 100 nm).

Gold was vapor-deposited on the hole transportation layer 3A using a vapor deposition method, thereby producing a second electrode 2 (having a film thickness of 100 nm).

A photoelectric conversion element and a solar cell (Specimen No. 101) were manufactured as described above.

The respective film thicknesses were observed and measured using a SEM according to the above-described method.

(Manufacturing of photoelectric conversion elements and solar cells (Specimen Nos. 102 to 109, 112, 113, 115 to 138, c101, and c102))

Photoelectric conversion elements and solar cells (Specimen Nos. 102 to 109, 112, 113, 115 to 138, c101, and c102) were respectively manufactured in the same manner as the photoelectric conversion element and the solar cell (Specimen No. 101) except for the fact that, in the manufacturing of the photoelectric conversion element and the solar cell (Specimen No. 101), amino compounds shown in the "$R^A$—$NH_2$" column in Table 1 were used, amino compounds shown in the "$(R^B)_{n2}$-L-$NH_2$" column in Table 1 were used, furthermore, light absorber solutions were respectively prepared at changed molar ratios shown in the "n" column in Table 1, and the obtained light absorber solutions were respectively used.

The obtained photoelectric conversion elements and solar cells (Specimen Nos. 102 to 109, 112, 113, 115 to 138) all included the perovskite compound which had the organic cation represented by Formula (IA) and was represented by Formula (I) in the photosensitive layer 13A.

(Manufacturing of Photoelectric Conversion Elements and Solar Cells (Specimen Nos. 110 and 111))

Photoelectric conversion elements and solar cells (Specimen Nos. 110 and 111) were respectively manufactured in the same manner as the photoelectric conversion element and the solar cell (Specimen No. 101) except for the fact that, in the manufacturing of the photoelectric conversion element and the solar cell (Specimen No. 101), light absorber solutions prepared as described below were used.

The obtained photoelectric conversion elements and solar cells (Specimen Nos. 110 and 111) all included the perovskite compound which had the organic cation represented by Formula (IA) and was represented by Formula (I) in the photosensitive layer 13A.

A 40% methanol solution of methylamine (27.86 mL) and 57% by mass of hydrobromic acid (30 mL) were stirred in a flask at 0° C. for two hours and then were condensed, thereby obtaining a $CH_3NH_3Br$ coarse body. The obtained coarse body was dissolved in ethanol and was recrystallized with diethyl ether, and the obtained crystals were filtered and were dried at 50° C. for five hours under reduced pressure, thereby obtaining purified $CH_3NH_3Br$.

In addition, $N(CH_3)_2CH_2CH_2NH_2$ (Compound L-1-2) and 57% by mass of hydrobromic acid were fed into ethanol in the flask at a molar ratio of 1:1, were stirred at 0° C. for two hours, then, were heated to 50° C., and were stirred for one hour. After that, the components were condensed, thereby obtaining a $N(CH_3)_2CH_2CH_2NH_3Br$ coarse body. The obtained coarse body was recrystallized with acetonitrile, and the obtained crystals were filtered and were dried at 50° C. for five hours under reduced pressure, thereby obtaining purified $N(CH_3)_2CH_2CH_2NH_3Br$.

Next, the purified $CH_3NH_3Br$, the purified $N(CH_3)_2CH_2CH_2NH_3Br$, and $PbBr_2$ were stirred and mixed together at 60° C. in DMF for 12 hours at a molar ratio of 0.5:0.5:1.0 (Specimen No. 110) or 0.9:0.1:1.0 (Specimen No. 111) and then were filtered using a polytetrafluoroethylene (PTFE) syringe filter, thereby preparing 40% by mass of a light absorber solution.

(Manufacturing of Photoelectric Conversion Element and Solar Cell (Specimen No. 114))

A photoelectric conversion element and a solar cell (Specimen No. 114) were manufactured in the same manner as the photoelectric conversion element and the solar cell (Specimen No. 101) except for the fact that, in the manufacturing of the photoelectric conversion element and the solar cell (Specimen No. 101), a light absorber solution prepared as described below was used.

The obtained photoelectric conversion element and solar cell (Specimen No. 114) included the perovskite compound which had the organic cation represented by Formula (IA) and was represented by Formula (I) in the photosensitive layer 13A.

In addition, ethylenediamine (a precursor of Compound L-1-4) and 57% by mass of hydroiodic acid were fed into ethanol in the flask at a molar ratio of 1:2, were stirred at 0° C. for two hours, then, were heated to 50° C., and were stirred for one hour. After that, the components were condensed, thereby obtaining a $NH_2CH_2CH_2NH_2 \cdot 2HI$ coarse body. The obtained coarse body was recrystallized with acetonitrile, and the obtained crystals were filtered and were dried at 50° C. for five hours under reduced pressure, thereby obtaining purified $NH_2CH_2CH_2NH_2 \cdot 2HI$.

Next, purified $CH_3NH_3I$, the purified $NH_2CH_2CH_2NH_2 \cdot 2HI$, and $PbI_2$ were stirred and mixed together at 60° C. in DMF for 12 hours at a molar ratio of 0.9:0.1:1 and then were filtered using a polytetrafluoroethylene (PTFE) syringe filter, thereby preparing 40% by mass of a light absorber solution.

(Manufacturing of Photoelectric Conversion Element and Solar Cell (Specimen No. 139))

A photoelectric conversion element and a solar cell (Specimen No. 139) were manufactured in the same manner as the photoelectric conversion element and the solar cell (Specimen No. 101) except for the fact that, in the manufacturing of the photoelectric conversion element and the solar cell (Specimen No. 101), a light absorber solution prepared as described below was used.

The obtained photoelectric conversion element and solar cell (Specimen No. 139) included the perovskite compound which had the organic cation represented by Formula (IA) and was represented by Formula (I) in the photosensitive layer 13A.

A 40% methanol solution of formamidine acetate (27.86 mL) and 57% by mass of hydroiodic acid (30 mL) were stirred in a flask at 0° C. for two hours and then were condensed, thereby obtaining a $HC(=NH)NH_3I$ coarse body. The obtained coarse body was dissolved in ethanol and was recrystallized with diethyl ether, and the obtained crystals were filtered and were dried at 50° C. for five hours under reduced pressure, thereby obtaining purified $HC(=NH)NH_3I$. Next, the purified $HC(=NH)NH_3I$, purified $N(CH_3)_2CH_2CH_2NH_3I$, and $PbI_2$ were stirred and mixed together at 60° C. in DMF for 12 hours at a molar ratio of 0.85:0.15:1.0 and then were filtered using a polytetrafluoroethylene (PTFE) syringe filter, thereby preparing 40% by mass of a light absorber solution.

(Manufacturing of Photoelectric Conversion Element and Solar Cell (Specimen No. c103))

A photoelectric conversion element and a solar cell (Specimen No. c103) were manufactured in the same manner as the photoelectric conversion element and the solar cell (Specimen No. 101) except for the fact that, in the manufacturing of the photoelectric conversion element and the solar cell (Specimen No. 101), a light absorber solution prepared as described below was used.

A 40% methanol solution of ethylamine (27.86 mL) and 57% by mass of hydroiodic acid (30 mL) were stirred in a flask at 0° C. for two hours and then were condensed, thereby obtaining a $CH_3CH_2NH_3I$ coarse body. The obtained coarse body was dissolved in ethanol and was recrystallized with diethyl ether, and the obtained crystals were filtered and were dried at 50° C. for five hours under reduced pressure, thereby obtaining purified $CH_3CH_2NH_3I$. Next, purified $CH_3NH_3I$ obtained in the same manner as in the manufacturing of the photoelectric conversion element and the solar cell (Specimen No. 101), the purified $CH_3CH_2NH_3I$, and $PbI_2$ were stirred and mixed together at 60° C. in DMF for 12 hours at a molar ratio of 0.9:0.1:1 (n=0) and then were filtered using a polytetrafluoroethylene (PTFE) syringe filter, thereby preparing 40% by mass of a light absorber solution.

(Manufacturing of Photoelectric Conversion Element and Solar Cell (Specimen No. c104))

A photoelectric conversion element and a solar cell (Specimen No. c104) were manufactured in the same manner as the photoelectric conversion element and the solar cell (Specimen No. 101) except for the fact that, in the manufacturing of the photoelectric conversion element and the solar cell (Specimen No. 101), a light absorber solution prepared as described below was used.

Next, purified $CH_3NH_3I$ obtained in the same manner as in the manufacturing of the photoelectric conversion element and the solar cell (Specimen No. 101), purified $HN=CHNH_3I$, and $PbI_2$ were stirred and mixed together at 60° C. in DMF for 12 hours at a molar ratio of 0.4:0.6:1 (n=0) and then were filtered using a polytetrafluoroethylene (PTFE) syringe filter, thereby preparing 40% by mass of a light absorber solution.

(Evaluation of Variation in Photoelectric Conversion Efficiency)

For each of the solar cells having a different specimen No., the variation in the moisture-heat resistance of the photoelectric conversion efficiency was evaluated in the following manner.

Ten test bodies of each of the solar cells having a different specimen No. were manufactured. An initial cell characteristic test was performed using each of the test bodies by radiating 1,000 W/m$^2$ of simulated sunlight which had passed through an AM 1.5 filter from a xenon lamp using a solar simulator "WXS-85H" (manufactured by Wacom Electric Co., Ltd.). In this test, the current-voltage characteristics were measured using an I-V tester, and the initial photoelectric conversion efficiency ($\eta$/%) was obtained.

Next, ten test bodies of the solar cell were left to stand in a dark environment of a relative humidity of 60% and a temperature of 45° C. for 80 hours, and then the photoelectric conversion efficiency over time ($\eta$/%) was obtained in the same manner as in the measurement of the initial photoelectric conversion efficiency.

A decrease percentage of the photoelectric conversion efficiency was computed according to the following expression from the initial photoelectric conversion efficiency and the photoelectric conversion efficiency over time which were measured for each test body as described above.

Expression: Decrease percentage (%): 100−(photoelectric conversion efficiency over time/initial photoelectric conversion efficiency)×100

The respective decrease percentages of the ten test bodies computed as described above were considered as "decrease percentage (Bn) of test bodies" (n represents an integer of 1 to 10). In addition, the average value of the decrease percentage (Bn) of ten test bodies was obtained and was considered as "average decrease percentage (A)".

For each of the ten test bodies of the solar cells, the resistance variation values (C) were obtained using the following expression from the average decrease percentages (A) and the test body decrease percentages (Bn).

Expression: Resistance variation values (C)=1−(test body decrease percentages (Bn)/average decrease percentage (A))

The evaluation indexes for the variation in the moisture-heat resistance were set from a range in which, out of the obtained resistance variation values (C) of the ten test bodies, the maximum value (Cmax) was included. For the variation in moisture-heat resistance, evaluation needs to be D or higher in order to pass the present test and is preferably C or higher.

A+: 0 or more and ±0.12 or less
A: more than ±0.12 and ±0.14 or less
B+: more than ±0.14 and ±0.16 or less
B: more than ±0.16 and ±0.18 or less
C+: more than ±0.18 and ±0.20 or less
C: more than ±0.20 and ±0.22 or less
D: more than ±0.22 and ±0.24 or less
E: more than ±0.24 and ±0.26 or less
F: more than ±0.26.

In the evaluation of the variation in moisture-heat resistance, the photoelectric conversion efficiency of the solar cell of Specimen No. 101 was at a level at which the solar cell was capable of sufficiently functioning as a solar cell.

TABLE 1

| Specimen No. | $R^A$—$NH_2$ | $(R^B)_{n2}$—L—$NH_2$ | n | M | X | Variation in resistance | Note |
|---|---|---|---|---|---|---|---|
| c101 | $CH_3$—$NH_2$ | — | 0 | Pb | I | F | Comparative Example |
| c102 | — | S-1 | 1 | Pb | I | E | Comparative Example |
| c103 | $CH_3$—$NH_2$ $CH_3CH_2$—$NH_2$ | — | 0 | Pb | I | F | Comparative Example |
| c104 | $CH_3$—$NH_2$ HC(=NH)—$NH_2$ | — | 0 | Pb | I | E | Comparative Example |
| 101 | $CH_3$—$NH_2$ | L-1-2 | 0.05 | Pb | I | C | Present Invention |
| 102 | $CH_3$—$NH_2$ | L-1-2 | 0.1 | Pb | I | C+ | Present Invention |
| 103 | $CH_3$—$NH_2$ | L-1-2 | 0.15 | Pb | I | B | Present Invention |
| 104 | $CH_3$—$NH_2$ | L-1-2 | 0.25 | Pb | I | B | Present Invention |
| 105 | $CH_3$—$NH_2$ | L-1-2 | 0.3 | Pb | I | B | Present Invention |
| 106 | $CH_3$—$NH_2$ | L-1-2 | 0.4 | Pb | I | C+ | Present Invention |
| 107 | $CH_3$—$NH_2$ | L-1-2 | 0.5 | Pb | I | C+ | Present Invention |
| 108 | $CH_3$—$NH_2$ | L-1-2 | 0.55 | Pb | I | C | Present Invention |
| 109 | $CH_3$—$NH_2$ | L-1-2 | 0.9 | Pb | I | C | Present Invention |
| 110 | $CH_3$—$NH_2$ | L-1-2 | 0.5 | Pb | Br | C+ | Present Invention |
| 111 | $CH_3$—$NH_2$ | L-1-2 | 0.1 | Pb | Br | C+ | Present Invention |
| 112 | $CH_3$—$NH_2$ | L-1-1 | 0.1 | Pb | I | B | Present Invention |
| 113 | $CH_3$—$NH_2$ | L-1-3 | 0.1 | Pb | I | B | Present Invention |
| 114 | $CH_3$—$NH_2$ | L-1-4 | 0.1 | Pb | I | B | Present Invention |
| 115 | $CH_3$—$NH_2$ | L-2-1 | 0.1 | Pb | I | B+ | Present Invention |
| 116 | $CH_3$—$NH_2$ | L-2-2 | 0.1 | Pb | I | B+ | Present Invention |
| 117 | $CH_3$—$NH_2$ | L-3-1 | 0.1 | Pb | I | B+ | Present Invention |
| 118 | $CH_3$—$NH_2$ | L-4-1 | 0.1 | Pb | I | B | Present Invention |
| 119 | $CH_3$—$NH_2$ | L-5-1 | 0.1 | Pb | I | B | Present Invention |
| 120 | $CH_3$—$NH_2$ | L-6-1 | 0.1 | Pb | I | B | Present Invention |
| 121 | $CH_3$—$NH_2$ | L-6-2 | 0.1 | Pb | I | B | Present Invention |
| 122 | $CH_3$—$NH_2$ | L-6-3 | 0.1 | Pb | I | B | Present Invention |
| 123 | $CH_3$—$NH_2$ | L-7-1 | 0.1 | Pb | I | B | Present Invention |
| 124 | $CH_3$—$NH_2$ | L-7-2 | 0.1 | Pb | I | B | Present Invention |
| 125 | $CH_3$—$NH_2$ | S-1 | 0.1 | Pb | I | B | Present Invention |
| 126 | $CH_3$—$NH_2$ | L-8-2 | 0.1 | Pb | I | B | Present Invention |
| 127 | $CH_3$—$NH_2$ | L-8-4 | 0.1 | Pb | I | B+ | Present Invention |
| 128 | $CH_3$—$NH_2$ | L-9-1 | 0.1 | Pb | I | B | Present Invention |

TABLE 1-continued

| Specimen No. | $R^A$—$NH_2$ | $(R^B)_{n2}$—L—$NH_2$ | n | M | X | Variation in resistance | Note |
|---|---|---|---|---|---|---|---|
| 129 | $CH_3$—$NH_2$ | L-9-2 | 0.1 | Pb | I | B | Present Invention |
| 130 | $CH_3$—$NH_2$ | L-9-4 | 0.05 | Pb | I | B | Present Invention |
| 131 | $CH_3$—$NH_2$ | L-9-4 | 0.1 | Pb | I | B+ | Present Invention |
| 132 | $CH_3$—$NH_2$ | L-9-4 | 0.15 | Pb | I | A | Present Invention |
| 133 | $CH_3$—$NH_2$ | L-9-4 | 0.25 | Pb | I | A | Present Invention |
| 134 | $CH_3$—$NH_2$ | L-9-4 | 0.3 | Pb | I | A | Present Invention |
| 135 | $CH_3$—$NH_2$ | L-9-4 | 0.5 | Pb | I | B+ | Present Invention |
| 136 | $CH_3$—$NH_2$ | L-9-4 | 0.55 | Pb | I | B | Present Invention |
| 137 | $CH_3$—$NH_2$ | L-9-4 | 0.4 | Pb | I | B+ | Present Invention |
| 138 | $CF_3CH_2$—$NH_2$ | L-9-4 | 0.15 | Pb | I | A+ | Present Invention |
| 139 | HC(=NH)—$NH_2$ | L-1-2 | 0.15 | Pb | I | B | Present Invention |

As shown in Table 1, it was found that the solar cells of the present invention which included the photosensitive layer 13 including the perovskite-type light absorber which had a perovskite-type crystal structure in which the organic cation represented by Formula (IA), a metallic cation, and an anion were provided were all evaluated to be C or higher in terms of the variation in moisture-heat resistance, allowed the valuation only to a small extent, and exhibited stable cell performance.

In addition, it was found that, when a photosensitive layer is formed using a light absorber solution including the perovskite-type light absorber, it is possible to manufacture photoelectric conversion elements exhibiting stable cell performance even in a high-temperature and humidity environment.

Furthermore, the photoelectric conversion efficiencies over time (η/%) of the present invention were all sufficient photoelectric conversion efficiencies at which the solar cells were capable of normally operating as solar cells.

In the perovskite-type light absorber, when n in Formula (IA) was in a range of 0.10 to 0.50 and, furthermore, in a range of 0.15 to 0.30, it was possible to further decrease the variation in moisture-heat resistance. In addition, when $R^A$ in Formula (IA) was an alkyl group substituted with a halogen atom, it was possible to sufficiently suppress the variation in moisture-heat resistance. Furthermore, it was found that, when the linking group L in Formula (IA) has the group represented by Formula L-2, L-3, L-10, or L-11, the variation in the moisture-heat resistance is excellent.

In contrast, when a perovskite-type light absorber including only one cation of the two cations represented by Formula (IA) was used, it was not possible to suppress the variation in moisture-heat resistance. This point was still valid regardless of which cation out of the two cations was used as long as the perovskite-type light absorber included only one cation (Specimen Nos. c101 and c102). In addition, even when two kinds of the compound represented by [$R^A$—$NH_2$] was used, it was not possible to suppress the variation in the moisture-heat resistance (Specimen No. c103). Similarly, even when the perovskite-type light absorber including two kinds of cations of a formamidinium cation (formamidine) and a methylammonium cation (methylamine) was used, it was not possible to suppress the variation in the moisture-heat resistance (Specimen No. c104).

Example 2

In the present example, the photoelectric conversion element 10C illustrated in FIG. 3 was manufactured, and the characteristics were evaluated.

Photoelectric conversion elements and solar cells (Specimen Nos. c201 to c204, 215, and 216) were respectively manufactured in the same manner as the photoelectric conversion elements and the solar cells (Specimen Nos. c101 to c104, 115, and 116) of Example 1 except for the fact that, in the manufacturing of the photoelectric conversion elements and the solar cells of Example 1, the porous layer 12 was not provided.

The variations in the moisture-heat resistance of the manufactured solar cells were evaluated in the same manner as in Example 1, and consequently, it was found that the solar cells of Specimen Nos. 215 and 216 all allowed variation in the moisture-heat resistance only to a small extent and exhibited stable cell performance. On the other hand, the solar cells of Specimen Nos. c201 to c204 were all in capable of suppressing variation in moisture-heat resistance.

Example 3

In the present example, photoelectric conversion elements not provided with the hole transportation layer (refer to the photoelectric conversion element 10F illustrated in FIG. 6) and solar cells were manufactured, and the characteristics were evaluated.

Photoelectric conversion elements and solar cells (Specimen Nos. c301 to c304, 315, and 316) were respectively manufactured in the same manner as the photoelectric conversion elements and the solar cells (Specimen Nos. c101 to c104, 115, and 116) of Example 1 except for the fact that, in the manufacturing of the photoelectric conversion elements and the solar cells of Example 1, the hole transportation layer 3A was not provided.

The variations in the photoelectric conversion efficiency of the manufactured solar cells were evaluated in the same manner as in Example 1, and consequently, it was found that the solar cells of Specimen Nos. 315 and 316 all allowed variation in the moisture-heat resistance only to a small extent and exhibited stable cell performance. On the other hand, the solar cells of Specimen Nos. c301 to c304 were all incapable of suppressing variation in moisture-heat resistance.

The present invention has been described together with embodiments thereof, but the present inventors do not limit the present invention in any detailed part of the description unless particularly otherwise described and consider that the present invention is supposed to be widely interpreted within the scope of the concept of the present invention which is described in the accompanying claims.

The present application claims priority on the basis of JP2014-086642, filed on Apr. 18, 2014, and JP2015-057611, filed on Mar. 20, 2015, the contents of which are incorporated herein by reference.

EXPLANATION OF REFERENCES 1A to 1F: first electrode
11: conductive support
11a: support
11b: transparent electrode
12: porous layer
13A to 13C: photosensitive layer
14: blocking layer
2: second electrode
3A, 3B, 16: hole transportation layer
4, 15: electron transportation layer
6: external circuit (lead)
10A to 10F: photoelectric conversion element
100A to 100F: system using solar cell
M: electric motor

What is claimed is:

1. A photoelectric conversion element comprising:
a first electrode having a photosensitive layer including a light absorber on a conductive support; and
a second electrode facing the first electrode,
wherein the light absorber includes a compound having a perovskite-type crystal structure having an organic cation represented by Formula (IA) below, a cation of a metallic atom, and an anion that is an anionic atom or atomic group,

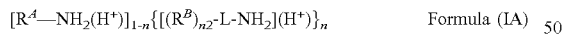    Formula (IA)

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying $0<n<1.00$,

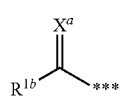    Formula (2)

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA),
wherein $R^A$ is an alkyl group substituted with a halogen atom.

2. A photoelectric conversion element comprising:
a first electrode having a photosensitive layer including a light absorber on a conductive support; and
a second electrode facing the first electrode,
wherein the light absorber includes a compound having a perovskite-type crystal structure having an organic cation represented by Formula (IA) below, a cation of a metallic atom, and an anion that is an anionic atom or atomic group,

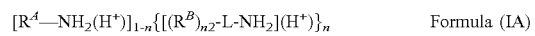    Formula (IA)

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying $0<n<1.00$,

    Formula (2)

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA),
wherein n2 is an integer of 2 or more.

3. A photoelectric conversion element comprising:
a first electrode having a photosensitive layer including a light absorber on a conductive support; and
a second electrode facing the first electrode,
wherein the light absorber includes a compound having a perovskite-type crystal structure having an organic cation represented by Formula (IA) below, a cation of a metallic atom, and an anion that is an anionic atom or atomic group,

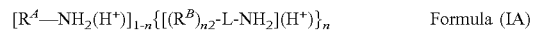    Formula (IA)

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying $0<n<1.00$,

    Formula (2)

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA), wherein L has at least one group selected from the group consisting of groups represented by Formula L-1 to Formula L-9 below,

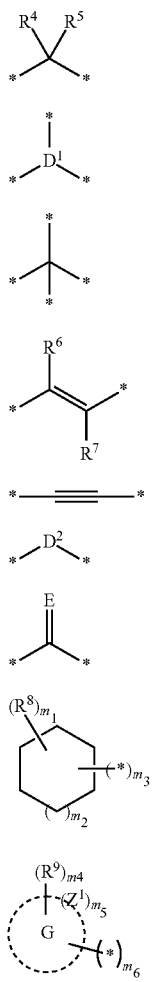

in the formulae, * represents a linking location to $R^B$, to $NH_2$, or to the group represented by any of the above-illustrated formulae L-1 to L-9 when L is a group formed of a combination of at least two groups selected from the group consisting of groups represented by the above-illustrated formulae L-1 to L-9, in which multiple groups of the same kind may be combined together, or different groups may be combined together, with the proviso that a combination of groups represented only by the above-illustrated formula L-1 is excluded, $D^1$ represents a nitrogen atom or $CR^{10}$, $D^2$ represents an oxygen atom, a sulfur atom, or $NR^{11}$, E represents an oxygen atom, a sulfur atom, or $NR^{12}$, a ring G represents an aryl ring or a heteroaryl ring, $Z^1$ represents a hetero atom or $NR^{13}$, $R^8$ and $R^9$ each independently represent a substituent, $R^4$ to $R^7$ and $R^{10}$ to $R^{13}$ each independently represent a hydrogen atom or a substituent, m1, m2, m4, and m5 each independently represent an integer of 0 or more, and m3 and m6 each independently represent an integer of 2 or more.

4. A photoelectric conversion element comprising:
a first electrode having a photosensitive layer including a light absorber on a conductive support; and
a second electrode facing the first electrode,
wherein the light absorber includes a compound having a perovskite-type crystal structure having an organic cation represented by Formula (IA) below, a cation of a metallic atom, and an anion that is an anionic atom or atomic group,

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying 0<n<1.00,

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA), wherein L has at least one group selected from the group consisting of groups represented by Formulae L-2, L-3, L-10, and L-11 below,

in the formulae, * represents a linking location to $R^B$, to $NH_2$ or to the group represented by any of the above-illustrated formulae L-2, L-3, L-10, and L-11 when L is a group formed of a combination of at least two groups selected from the group consisting of groups represented by the above-illustrated formulae L-2, L-3, L-10, and L-11, in which multiple groups of the same kind may be combined together, or different groups may be combined together, $D^1$ represents a nitrogen atom or $CR^{10}$, a ring G represents an aryl ring or a heteroaryl ring, $Z^1$ represents a hetero atom or $NR^{13}$, $R^{10}$ and $R^{13}$ each independently represent a hydrogen atom or a substituent, m5 and m7 each independently represent an integer of 0 or more, and m8 and m9 each independently represent an integer of 3 or more.

5. A photoelectric conversion element comprising:
a first electrode having a photosensitive layer including a light absorber on a conductive support; and
a second electrode facing the first electrode,
wherein the light absorber includes a compound having a perovskite-type crystal structure having an organic cation represented by Formula (IA) below, a cation of a metallic atom, and an anion that is an anionic atom or atomic group,

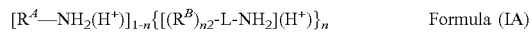
Formula (IA)

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying 0<n<1.00,

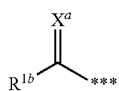
Formula (2)

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA),
wherein the compound having the perovskite-type crystal structure is represented by Formula (I) below, $$A_aM_mX_x \quad \text{Formula (I)}$$

in the formula, A represents a cationic organic group, M represents a metallic atom, X represents an anionic atom or atomic group, a represents 1 or 2, m represents 1, and a, m, and x satisfy a+2m=x;
wherein L has at least one group selected from the group consisting of groups represented by Formula L-1 to Formula L-9 below,

L-1

L-2

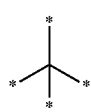
L-3

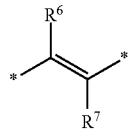
L-4

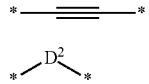
L-5

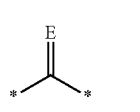
L-6

L-7

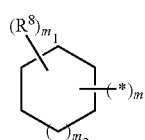
L-8

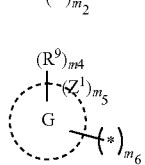
L-9 in the formulae, * represents a linking location to $R^B$, to $NH_2$, or to the group represented by any of the above-illustrated formulae L-1 to L-9 when L is a group formed of a combination of at least two groups selected from the group consisting of groups represented by the above-illustrated formulae L-1 to L-9, in which multiple groups of the same kind may be combined together, or different groups may be combined together, with the proviso that a combination of groups represented only by the above-illustrated formula L-1 is excluded, $D^1$ represents a nitrogen atom or $CR^{10}$, $D^2$ represents an oxygen atom, a sulfur atom, or $NR^{11}$, E represents an oxygen atom, a sulfur atom, or $NR^{12}$, a ring G represents an aryl ring or a heteroaryl ring, $Z^1$ represents a hetero atom or $NR^{13}$, $R^8$ and $R^9$ each independently represent a substituent, $R^4$ to $R^7$ and $R^{10}$ to $R^{13}$ each independently represent a hydrogen atom or a substituent, m1, m2, m4, and m5 each independently represent an integer of 0 or more, and m3 and m6 each independently represent an integer of 2 or more.

6. A photoelectric conversion element comprising:
a first electrode having a photosensitive layer including a light absorber on a conductive support; and
a second electrode facing the first electrode,
wherein the light absorber includes a compound having a perovskite-type crystal structure having an organic cation represented by Formula (IA) below, a cation of a metallic atom, and an anion that is an anionic atom or atomic group,

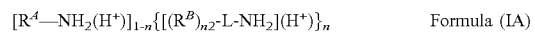
Formula (IA)

in the formula, $R^A$ represents an alkyl group, a cycloalkyl group, an alkenyl group, an alkynyl group, an aryl group, a heteroaryl group, or a group that can be represented by Formula (2) below, $R^B$ represents $NR^1R^2$ or $(NR^1R^2R^3)^+$, $R^1$, $R^2$, and $R^3$ each independently represent a hydrogen atom or a substituent, L represents a linking group, n2 represents an integer of 1 or more, $(R^B)_{n2}$-L is a group different from $R^A$, and n represents a numerical value satisfying 0<n<1.00,

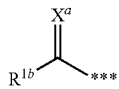 Formula (2)

in the formula, $X^a$ represents $NR^{1c}$, an oxygen atom, or a sulfur atom, $R^{1b}$ and $R^{1c}$ each independently represent a hydrogen atom or a substituent, and *** represents a bonding location to the N atom in Formula (IA), wherein the compound having the perovskite-type crystal structure is represented by Formula (I) below,

 Formula (I)

in the formula, A represents a cationic organic group, M represents a metallic atom, X represents an anionic atom or atomic group, a represents 1 or 2, m represents 1, and a, m, and x satisfy a+2m=x;

wherein L has at least one group selected from the group consisting of groups represented by Formulae L-2, L-3, L-10, and L-11 below,

 L-2

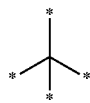 L-3

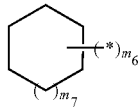 L-10

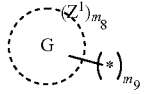 L-11 in the formulae, * represents a linking location to $R^B$, to $NH_2$ or to the group represented by any of the above-illustrated formulae L-2, L-3, L-10, and L-11 when L is a group formed of a combination of at least two groups selected from the group consisting of groups represented by the above-illustrated formulae L-2, L-3, L-10, and L-11, in which multiple groups of the same kind may be combined together, or different groups may be combined together, $D^1$ represents a nitrogen atom or $CR^{10}$, a ring G represents an aryl ring or a heteroaryl ring, $Z^1$ represents a hetero atom or $NR^{13}$, $R^{10}$ and $R^{13}$ each independently represent a hydrogen atom or a substituent, m5 and m7 each independently represent an integer of 0 or more, and m8 and m9 each independently represent an integer of 3 or more.

* * * * *